United States Patent
Baek

(10) Patent No.: US 12,040,278 B2
(45) Date of Patent: Jul. 16, 2024

(54) SEMICONDUCTOR DEVICE AND SEMICONDUCTOR PACKAGE INCLUDING THE SAME

(71) Applicant: SAMSUNG ELECTRONICS CO., LTD., Suwon-si (KR)

(72) Inventor: Kiwon Baek, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 171 days.

(21) Appl. No.: 17/562,477

(22) Filed: Dec. 27, 2021

(65) Prior Publication Data

US 2022/0384351 A1    Dec. 1, 2022

(30) Foreign Application Priority Data

Jun. 1, 2021    (KR) .................. 10-2021-0070959

(51) Int. Cl.
    *H01L 23/538*    (2006.01)
    *H01L 25/065*    (2023.01)
    *H01L 27/08*     (2006.01)
    *H01L 49/02*     (2006.01)

(52) U.S. Cl.
    CPC ...... *H01L 23/5384* (2013.01); *H01L 23/5385* (2013.01); *H01L 25/0657* (2013.01); *H01L 27/0805* (2013.01); *H01L 28/40* (2013.01); H01L 2224/16145 (2013.01)

(58) Field of Classification Search
    CPC . H01L 2225/06513; H01L 2225/06517; H01L 2225/0652; H01L 2225/06562; H01L 2225/1041; H01L 2225/06572; H01L 2225/06541; H01L 24/06; H01L 2224/06149; H01L 2224/16145; H01L 27/0805; H01L 28/40; H01L 23/50; H01L 23/5384; H01L 23/5385; H01L 23/49822; H01L 23/49827; H01L 25/0657
    See application file for complete search history.

(56) References Cited

U.S. PATENT DOCUMENTS

| | | |
|---|---|---|
| 7,531,905 B2 | 5/2009 | Ishino et al. |
| 8,253,244 B2 | 8/2012 | Kang |
| 9,136,251 B2 | 9/2015 | Cheah et al. |
| 9,167,694 B2 | 10/2015 | Sundaram et al. |
| 9,269,700 B2 | 2/2016 | Koopmans et al. |
| 10,797,028 B2 | 10/2020 | Liu et al. |
| 2013/0154074 A1 | 6/2013 | Oh |
| 2018/0102298 A1 | 4/2018 | Chen et al. |
| 2019/0385997 A1 | 12/2019 | Choi et al. |
| 2022/0254756 A1* | 8/2022 | Choi ............... H01L 25/18 |

\* cited by examiner

*Primary Examiner* — Michael Carter
*Assistant Examiner* — Lawrence C Tynes, Jr.
(74) *Attorney, Agent, or Firm* — Fish & Richardson P.C.

(57) ABSTRACT

A semiconductor device and semiconductor package, the device including a lower semiconductor chip including a lower through-electrode; an interposer mounted on the lower semiconductor chip, the interposer including an interposer substrate; a plurality of interposer through-electrodes penetrating through at least a portion of the interposer substrate in a vertical direction and electrically connected to the lower through-electrode; and at least one capacitor in the interposer substrate and electrically connected to at least one interposer through-electrode of the plurality of interposer through-electrodes; and an upper semiconductor chip mounted on the interposer and electrically connected to the interposer through-electrode.

20 Claims, 16 Drawing Sheets

SEMICONDUCTOR DEVICE AND SEMICONDUCTOR PACKAGE INCLUDING THE SAME

CROSS-REFERENCE TO RELATED APPLICATION

This application is based on and claims priority under 35 U.S.C. § 119 to Korean Patent Application No. 10-2021-0070959, filed on Jun. 1, 2021, in the Korean Intellectual Property Office, the disclosure of which is incorporated by reference herein in its entirety.

BACKGROUND

1. Field

Embodiments relate to a semiconductor device and a semiconductor package including the same.

2. Description of the Related Art

As the storage capacity of semiconductor devices has increased, semiconductor packages including semiconductor devices may be thinner and lighter. Accordingly, semiconductor devices may include a structure in which a plurality of semiconductor chips are stacked.

SUMMARY

The embodiments may be realized by providing a semiconductor device including a lower semiconductor chip including a lower through-electrode; an interposer mounted on the lower semiconductor chip, the interposer including an interposer substrate, a plurality of interposer through-electrodes penetrating through at least a portion of the interposer substrate in a vertical direction and electrically connected to the lower through-electrode, and at least one capacitor in the interposer substrate and electrically connected to at least one interposer through-electrode of the plurality of interposer through-electrodes; and an upper semiconductor chip mounted on the interposer and electrically connected to the plurality of interposer through-electrodes.

The embodiments may be realized by providing a semiconductor device including a base semiconductor chip including a base through-electrode; a first lower semiconductor chip mounted on the base semiconductor chip, the first lower semiconductor chip having a horizontal length less than a horizontal length of the base semiconductor chip, including a first lower through-electrode, and being electrically connected to the base through-electrode; a second lower semiconductor chip mounted on the first lower semiconductor chip, the second lower semiconductor chip including a second lower through-electrode electrically connected to the first lower through-electrode; an interposer mounted on the second lower semiconductor chip, the interposer including an interposer substrate, a plurality of interposer through-electrodes penetrating through at least a portion of the interposer substrate in a vertical direction and being electrically connected to the second lower through-electrode, and at least one capacitor in the interposer substrate and connected to at least one interposer through-electrode of the plurality of interposer through-electrodes; a first upper semiconductor chip mounted on the interposer and including a first upper through-electrode electrically connected to at least one interposer through-electrode of the plurality of interposer through-electrodes; a second upper semiconductor chip mounted on the first upper semiconductor chip; and a molding layer on the base semiconductor chip and surrounding the first lower semiconductor chip, the second lower semiconductor chip, the interposer, and the first upper semiconductor chip.

The embodiments may be realized by providing a semiconductor package including a package substrate; a base semiconductor chip mounted on the package substrate and having a base through-electrode; a lower semiconductor stack structure mounted on the base semiconductor chip, the lower semiconductor stack structure having a horizontal length less than a horizontal length of the base semiconductor chip and including a first lower semiconductor chip mounted on the base semiconductor chip and having a first lower through-electrode electrically connected to the base through-electrode, and a second lower semiconductor chip mounted on the first lower semiconductor chip and having a second lower through-electrode electrically connected to the first lower through-electrode; an interposer mounted on the lower semiconductor stack structure, the interposer including an interposer substrate, a plurality of interposer through-electrodes penetrating through at least a portion of the interposer substrate in a vertical direction and electrically connected to the second lower through-electrode, a capacitor in the interposer substrate and electrically connected to the plurality of interposer through-electrodes, and a redistribution pattern connecting the capacitor to at least one interposer through-electrode of the plurality of interposer through-electrodes; an upper semiconductor stack structure mounted on the interposer and including a first upper semiconductor chip mounted on the interposer and electrically connected to the plurality of interposer through-electrodes; and a second upper semiconductor chip mounted on the first upper semiconductor chip; and a molding layer on the base semiconductor chip and surrounding the lower semiconductor stack structure, the interposer, and the upper semiconductor stack structure.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
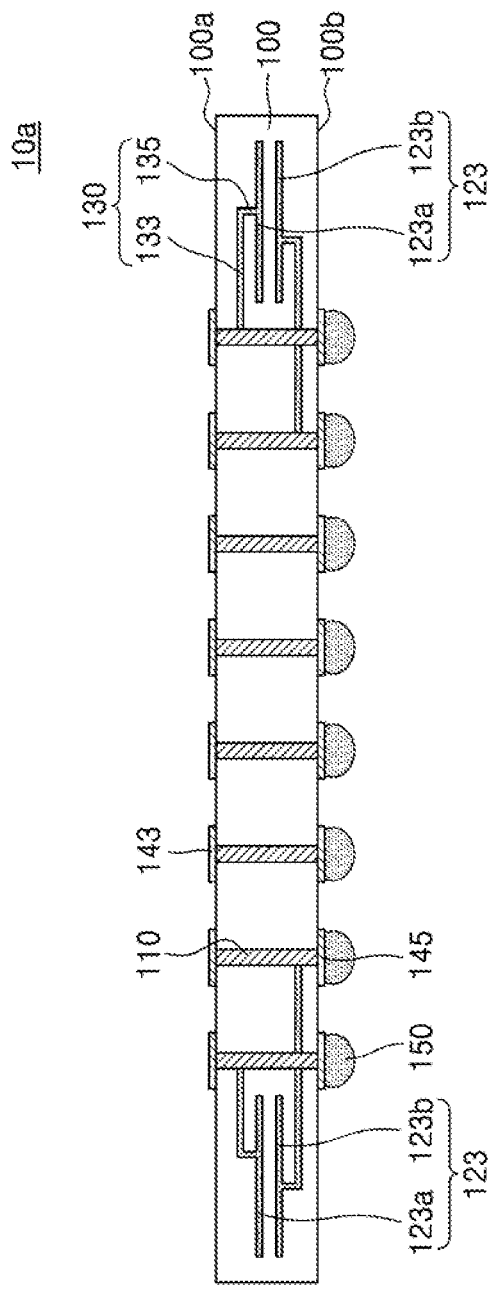
FIG. 1 is a cross-sectional view of an interposer according to an example embodiment.

FIG. 1 is a cross-sectional view of an interposer 10a according to an example embodiment.

The interposer 10a according to an example embodiment may include an interposer substrate 100, an interposer through-electrode 110, a capacitor 123, a redistribution pattern 130, an interposer upper pad 143, an interposer lower pad 145, an interposer connection terminal 150, or the like.

In an implementation, the interposer 10a may be between a plurality of semiconductor chips and may electrically connect the semiconductor chips to each other.

The interposer substrate 100 may include a first surface 100a and a second surface 100b opposite to the first surface 100a. Hereinafter, a direction parallel to a direction in which the first surface 100a and the second surface 100b of the interposer substrate 100 extend may be defined as a horizontal direction, and a direction perpendicular to the direction in which the first and second surfaces 100a and 100b extend may be defined as a vertical direction.

In an implementation, a material of the interposer substrate 100 may include silicon (Si). In an implementation, the interposer substrate 100 may include a semiconductor element such as germanium or may include semiconductor compounds such as silicon carbide (SiC), gallium arsenide (GaAs), indium arsenide (InAs), or indium phosphide (InP). As used herein, the term "or" is not an exclusive term, e.g., "A or B" would include A, B, or A and B.

The interposer through-electrode 110 may pass through at least a portion of the interposer substrate 100 in the vertical direction. In an implementation, the interposer through-electrode 110 may pass through or from the first surface 100a to the second surface 100b of the interposer substrate 100 in the vertical direction.

In an implementation, the interposer through-electrode 110 may have a cylindrical shape. In an implementation, the interposer through-electrode 110 may have a cylindrical shape in which a width in a horizontal direction is substantially the same or uniform, e.g., regardless of where in the vertical direction the width is measured.

In an implementation, the interposer through-electrode 110 may have a tapered shape with a horizontal width gradually decreasing farther away from the first surface 100a of the interposer substrate 100 in the vertical direction.

In an implementation, the interposer through-electrode 110 may include a seed layer conformally positioned on a surface of the interposer through-electrode 110 and a conductive layer on the seed layer.

In an implementation, the conductive layer may include a metallic material. In an implementation, the conductive layer may include, e.g., aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr).

The capacitor 123 may be inside the interposer substrate 100. In an implementation, the capacitor 123 may be electrically connected to a plurality of semiconductor chips mounted above or below the interposer 10a, and may be configured to help reduce noise in a high frequency band of the semiconductor chips.

In an implementation, the capacitor 123 may be configured to store electric charge or electrical energy. In an implementation, the capacitor 123 may include a plurality of conductive plates 123a and 123b having a plate shape and being spaced apart from each other (e.g., in the vertical direction). In an implementation, a portion of the interposer substrate 100, which is an insulating material, may be between the conductive plates 123a and 123b.

In an implementation, the conductive plates 123a and 123b may include an upper conductive plate 123a extending (e.g., lengthwise) in the horizontal direction inside the interposer substrate 100 and a lower conductive plate 123b spaced apart from the upper conductive plate 123a in the vertical direction and extending in the horizontal direction inside the interposer substrate 100.

The conductive plates 123a and 123b may extend in the horizontal direction and a portion of the interposer substrate 100, which is an insulating material, may be between the conductive plates 123a and 123b, so that the conductive plates 123a and 123b and the portion of the interposer substrate 100 may work together as a capacitor.

In an implementation, a material of the conductive plates 123a and 123b may include copper (Cu). In an implementation, the material of the conductive plates 123a and 123b may include a metal, e.g., nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), or the like, or an alloy thereof.

In an implementation, the capacitor 123 may be outside (e.g., at an outer side of) the interposer through-electrode 110. In an implementation, the interposer through-electrode 110 may be in or proximate to a center portion of the interposer substrate 100, and the capacitor 123 may be positioned at or proximate to an edge portion of the interposer substrate 100.

The redistribution pattern 130 may electrically connect the interposer through-electrode 110 to the capacitor 123 inside the interposer substrate 100. In an implementation, the redistribution pattern 130 may include a redistribution line pattern 133 extending in the horizontal direction inside the interposer substrate 100 and a redistribution via pattern 135 extending in the vertical direction inside the interposer substrate 100.

In an implementation, the redistribution line pattern 133 may extend in the horizontal direction inside the interposer substrate 100 to connect the redistribution via pattern 135 to the interposer through-electrode 110. In an implementation, the redistribution via pattern 135 may extend in the vertical direction inside the interposer substrate 100 to connect the capacitor 123 to the redistribution line pattern 133.

In an implementation, a material of the redistribution pattern 130 may include copper (Cu). In an implementation, the redistribution pattern 130 may include a metal, e.g., nickel (Ni), gold (Au), silver (Ag), aluminum (Al), tungsten (W), titanium (Ti), tantalum (Ta), Indium (In), molybdenum (Mo), manganese (Mn), cobalt (Co), tin (Sn), magnesium (Mg), rhenium (Re), beryllium (Be), gallium (Ga), or ruthenium (Ru), or an alloy thereof.

In an implementation, the material of the redistribution pattern 130 may be substantially the same as the material of the conductive plates 123a and 123b of the capacitor 123. In an implementation, the material of the redistribution pattern 130 and the material of the conductive plates 123a and 123b may include copper (Cu). In an implementation, the material of the redistribution pattern 130 may be different from the material of the conductive plates 123a and 123b of the capacitor 123.

In an implementation, any one of the redistribution patterns 130 may connect the upper conductive plate 123a to any one of the interposer through-electrodes 110, and the rest of the redistribution patterns 130 may connect the lower conductive plate 123b to the rest of the interposer through-electrodes 110.

The interposer upper pad 143 may be on the first surface 100a of the interposer substrate 100 and may be connected to an upper portion of the interposer through-electrode 110. In an implementation, the interposer upper pad 143 may be a pad for electrically connecting a semiconductor chip mounted on the interposer 10a to the interposer through-electrode 110.

In an implementation, the interposer lower pad 145 may be on the second surface 100b of the interposer substrate 100 and may be connected to a lower portion of the interposer through-electrode 110. In an implementation, the interposer lower pad 145 may be a pad for attaching the interposer connection terminal 150.

In an implementation, a material of the interposer upper pad 143 and the interposer lower pad 145 may include aluminum (Al). In an implementation, the material of the interposer upper pad 143 and the interposer lower pad 145 may include a metal, e.g., nickel (Ni), copper (Cu), gold (Au), silver (Ag), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), or ruthenium (Ru), or an alloy thereof.

The interposer connection terminal 150 may be a terminal for electrically connecting the interposer 10a to a semiconductor chip under the interposer 10a. In an implementation, the interposer connection terminal 150 may include a solder ball of a metal material including, e.g., tin (Sn), silver (Ag), copper (Cu), or aluminum (Al).

Figure 2:
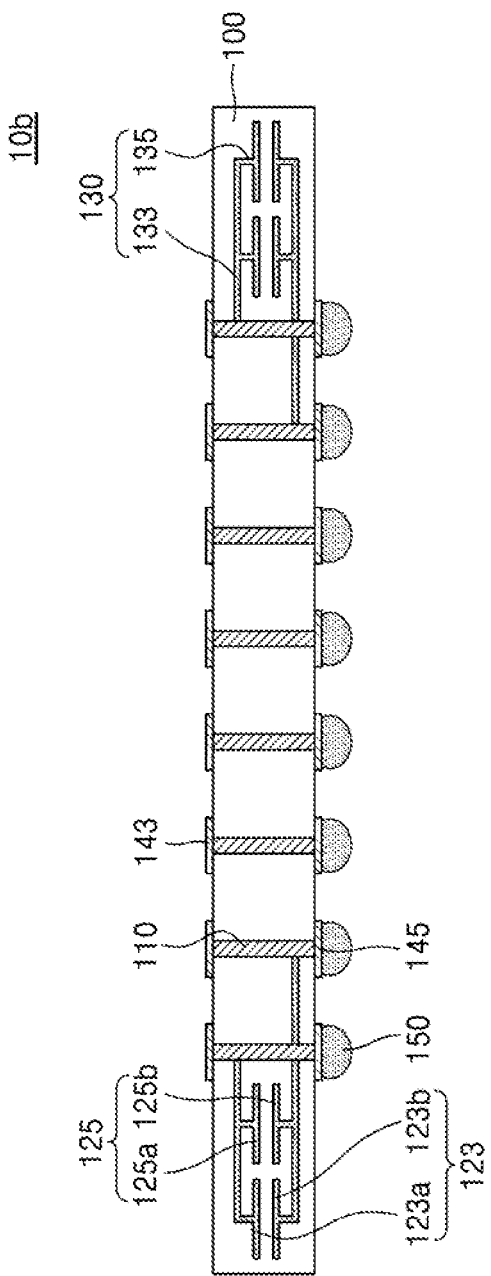
FIG. 2 is a cross-sectional view of an interposer according to an example embodiment.

FIG. 2 is a cross-sectional view of an interposer 10b according to an example embodiment.

Hereinafter, a description of common features of the interposer 10a of FIG. 1 and the interposer 10b of FIG. 2 may be omitted and differences therebetween may be mainly described.

Referring to FIG. 2, capacitors 123 and 125 may be provided in plurality outside the interposer through-electrode 110. In an implementation, the capacitors 123 and 125 may be electrically connected to each other through the redistribution pattern 130.

In an implementation, the capacitors 123 and 125 may be provided in plurality outside the interposer through-electrode 110. In an implementation, the capacitors 123 and 125 may include a first capacitor 123 outside the interposer through-electrode 110 and including a first upper conductive plate 123a and a first lower conductive plate 123b. In an implementation, the capacitors 123 and 125 may include a second capacitor 125 between the interposer through-electrode 110 and the first capacitor 123 and including a second upper conductive plate 125a and a second lower conductive plate 125b. As used herein, the terms "first," "second," and the like are merely for identification and differentiation, and are not intended to imply or require sequential inclusion (e.g., a third element and a fourth element may be described without implying or requiring the presence of a first element or second element).

In an implementation, the first and second capacitors 123 and 125 may be connected in parallel to each other. In an implementation, the first capacitor 123 and the second capacitor 125 may be connected in parallel to each other through the redistribution pattern 130 including the redistribution line pattern 133 and the redistribution via pattern 135. In an implementation, the first capacitor 123 and the second capacitor 125 may be connected in series through the redistribution pattern 130.

Figure 3:
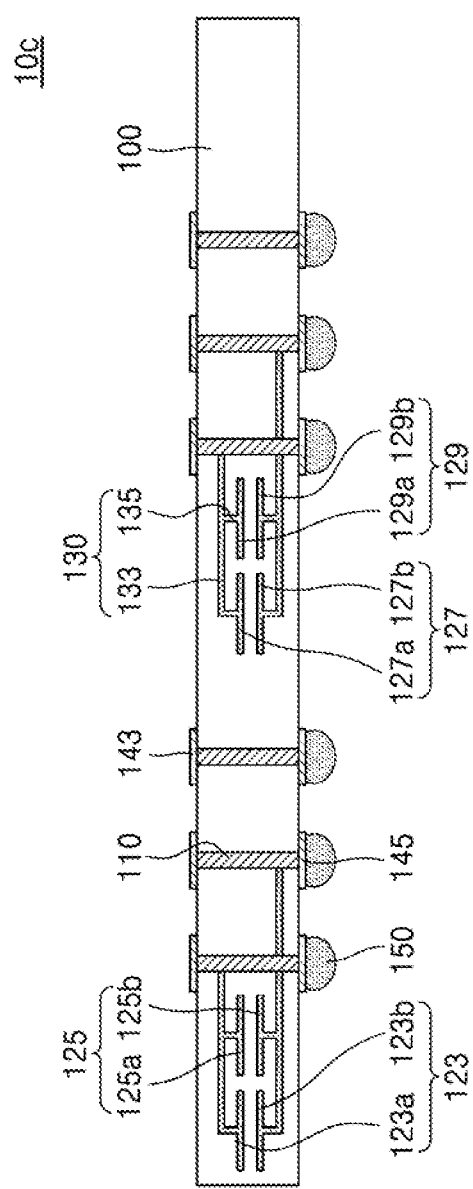
FIG. 3 is a cross-sectional view of an interposer according to an example embodiment.

FIG. 3 is a cross-sectional view of an interposer 10c according to an example embodiment.

Hereinafter, a description of common features of the interposer 10b of FIG. 2 and the interposer 10c of FIG. 3 may be omitted and differences therebetween may be mainly described.

Referring to FIG. 3, the interposer 10c may include a first capacitor 123 and a second capacitor 125 at or proximate to an edge of the interposer substrate 100 and a third capacitor 127 and a fourth capacitor 129 in or proximate to a central portion of the interposer substrate 100.

In an implementation, the first capacitor 123 and the second capacitor 125 may be outside (e.g., at an outer side of) the interposer through-electrode 110. In an implementation, the first capacitor 123 may include a first upper conductive plate 123a and a first lower conductive plate 123b, and the second capacitor 125 may include a second upper conductive plate 125a and a second lower conductive plate 125b. In an implementation, the first capacitor 123 and the second capacitor 125 may be connected in parallel through the redistribution pattern 130.

In an implementation, the third capacitor 127 and the fourth capacitor 129 may be in or near a central portion of the interposer 10c. In an implementation, the third capacitor 127 and the fourth capacitor 129 may be between a pair of the interposer through-electrodes 110.

The third capacitor 127 and the fourth capacitor 129 may be in or near the central portion of the interposer 10c, so that an electrical connection path between semiconductor chips mounted on the interposer 10c and the third and fourth capacitors 127 and 129 may be relatively short. Accordingly, noise in a high frequency band of the semiconductor chips may be improved.

In an implementation, the third capacitor 127 may include a third upper conductive plate 127a and a third lower conductive plate 127b, and the fourth capacitor 129 may include a fourth upper conductive plate 129a and a fourth lower conductive plate 129b. In an implementation, the third capacitor 127 and the fourth capacitor 129 may be connected in parallel through the redistribution pattern 130.

Figure 4:
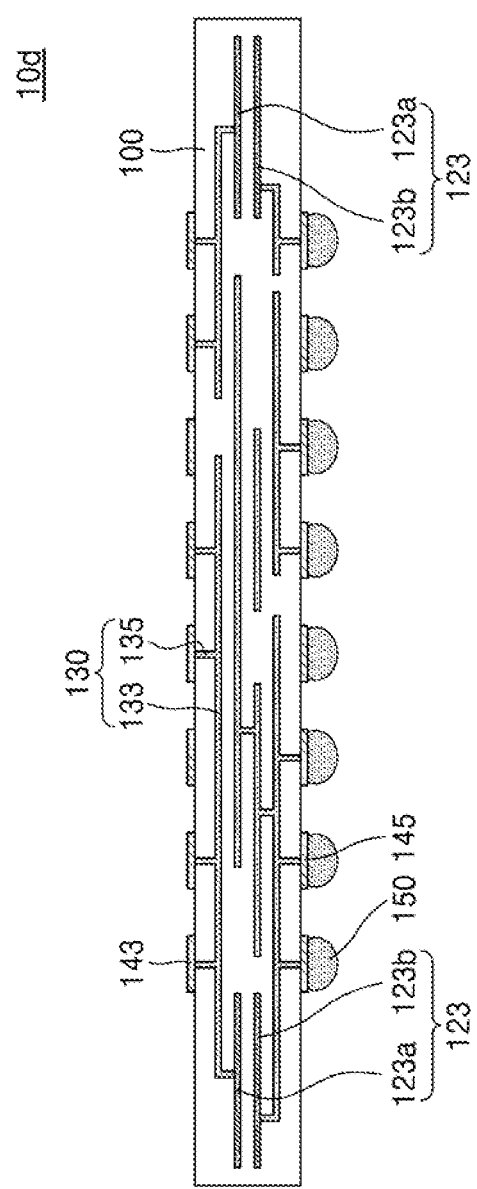
FIG. 4 is a cross-sectional view of an interposer according to an example embodiment.

FIG. 4 is a cross-sectional view of an interposer 10d according to an example embodiment.

Referring to FIG. 4, the interposer 10d may include an interposer substrate 100, a capacitor 123, a redistribution pattern 130, an interposer upper pad 143, an interposer lower pad 145, an interposer connection terminal 150, or the like. In an implementation, the interposer 10d may not include the interposer through-electrode 110.

In an implementation, the interposer 10d may electrically connect the interposer upper pad 143 to the interposer lower pad 145 through the redistribution line pattern 133 and the redistribution via pattern 135.

In an implementation, the interposer 10d may include a capacitor 123 inside the interposer substrate 100 and including an upper conductive plate 123a and a lower conductive plate 123b. In an implementation, as illustrated in FIG. 4, the capacitor 123 may be at or proximate to the edge of the interposer 10d, or the capacitor 123 may be in or proximate to a central portion of the interposer 10d.

In an implementation, the capacitor 123 may be provided in plurality inside the interposer substrate 100. In an implementation, the capacitor 123 may be electrically connected to the interposer upper pad 143 and the interposer lower pad 145 through the redistribution line pattern 133 and the redistribution via pattern 135.

Figure 5:
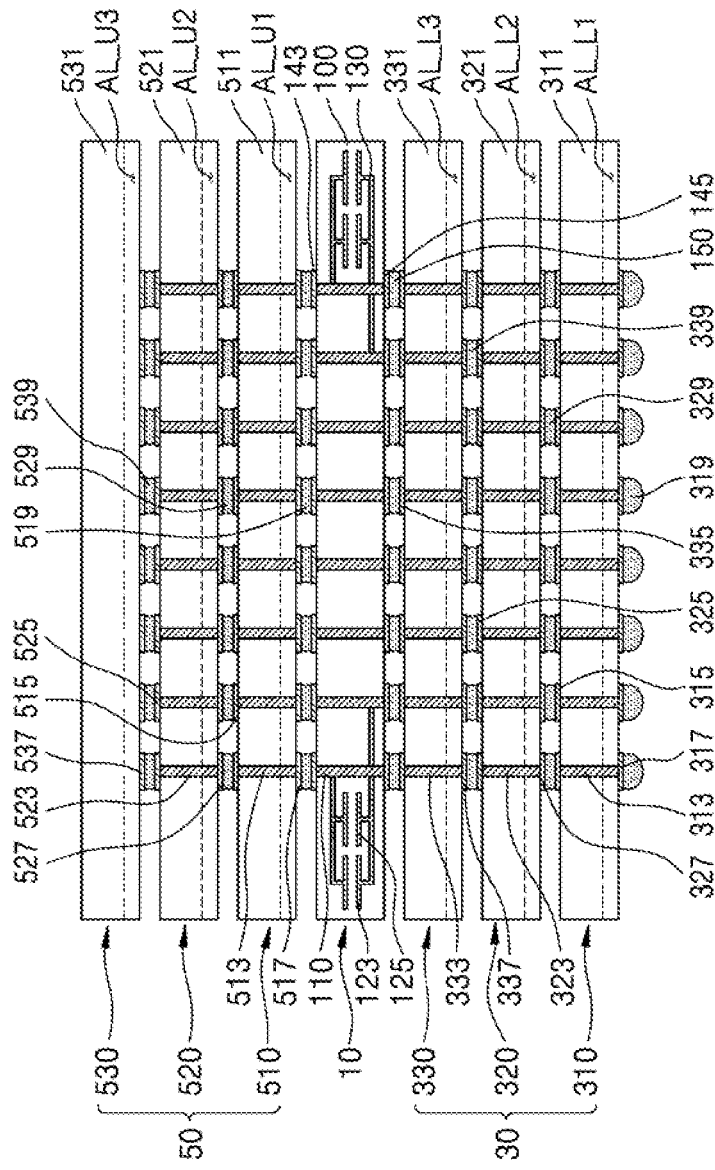
FIG. 5 is a cross-sectional view of a semiconductor device according to an example embodiment.

FIG. 5 is a cross-sectional view of a semiconductor device 1 according to an example embodiment.

Referring to FIG. 5, the semiconductor device 1 according to an example embodiment may include a lower semiconductor stack structure 30, an interposer 10 on the lower semiconductor stack structure 30, and an upper semiconductor stack structure 50 on the interposer 10.

The lower semiconductor stack structure 30 may include a first lower semiconductor chip 310, a second lower semiconductor chip 320 mounted on the first lower semiconductor chip 310, and a third lower semiconductor chip 330 mounted on the second lower semiconductor chip 320.

In an implementation, the first to third lower semiconductor chips 310, 320, and 330 may include a memory semiconductor chip. The memory semiconductor chip may include, e.g., a volatile memory semiconductor chip such as dynamic random access memory (DRAM) or static random access memory (SRAM) or a non-volatile memory semiconductor chip such as phase-change random access memory (PRAM), magneto-resistive memory (MRAM), ferroelectric random access memory (FeRAM), or resistive random access memory (RRAM).

In an implementation, the first to third lower semiconductor chips 310, 320, and 330 may include a logic semiconductor chip. The logic semiconductor chip may include, e.g., a logic semiconductor chip such as a central processor unit (CPU), a microprocessor unit (MPU), a graphics processor unit (GPU), or an application processor (AP).

In an implementation, as illustrated in the drawing, the lower semiconductor stack structure 30 may include three semiconductor chips, e.g., the first, second, and third semiconductor chips 310, 320, and 330, or may include a different number of semiconductor chips in the lower semiconductor stack structure 30.

In an implementation, the first lower semiconductor chip 310 may include a semiconductor substrate 311, a lower through-electrode 313, an upper pad 315, a lower pad 317, and a chip connection terminal 319.

The semiconductor substrate 311 of the first lower semiconductor chip 310 may have an active layer AL_L1 including a plurality of individual devices of various types. In an implementation, the individual devices may include various microelectronic devices, e.g., a complementary metal-oxide semiconductor (CMOS) transistor, a metal-oxide-semiconductor field effect transistor (MOSFET), and a system large scale integration (LSI), an image sensor such as a CMOS imaging sensor (CIS), a micro-electro-mechanical system (MEMS), an active device, or a passive device.

The lower through-electrode 313 of the first lower semiconductor chip 310 may be connected to the individual devices in the active layer AL_L1 vertically through at least a portion of the semiconductor substrate 311.

The upper pad 315 may be on an upper surface of the semiconductor substrate 311 and connected to an upper portion of the lower through-electrode 313, and the lower pad 317 may be on a lower surface of the semiconductor substrate 311 and connected to a lower portion of the lower through-electrode 313. In an implementation, the chip connection terminal 319 may be attached to the lower pad 317.

The second lower semiconductor chip 320 may include a semiconductor substrate 321 having an active layer AL_L2, a lower through-electrode 323, an upper pad 325, a lower pad 327, and a chip connection terminal 329.

In an implementation, the third lower semiconductor chip 330 may include a semiconductor substrate 331 having an active layer AL_L3, a lower through-electrode 333, an upper pad 335, a lower pad 337, and a chip connection terminal 339.

In an implementation, the chip connection terminal 329 of the second lower semiconductor chip 320 may be between the lower pad 327 of the second lower semiconductor chip 320 and the upper pad 315 of the first lower semiconductor chip 310, and the chip connection terminal 339 of the third lower semiconductor chip 330 may be between the lower pad 337 of the third lower semiconductor chip 330 and the upper pad 325 of the second lower semiconductor chip 320. In an implementation, the first to third lower semiconductor chips 310, 320, and 330 may be electrically connected to each other.

The interposer 10 may be mounted on the lower semiconductor stack structure 30. The interposer 10 may include one of the interposers 10a to 10d described above with reference to FIGS. 1 to 4. In an implementation, the interposer 10 included in the semiconductor device 1 of FIG. 5 may be the interposer 10b described above with reference to FIG. 2.

In an implementation, the interposer 10 may include the interposer substrate 100, the interposer through-electrode 110, the capacitors 123 and 125, the redistribution pattern 130, the interposer upper pad 143, the interposer lower pad 145, and the interposer connection terminal 150.

In an implementation, the interposer 10 may be mounted on the third lower semiconductor chip 330 so that the interposer connection terminal 150 of the interposer 10 is in contact with the upper pad 335 of the third lower semiconductor chip 330.

In an implementation, a plurality of individual devices in the active layers AL1 to AL3 of the first to third lower semiconductor chips 310, 320 and 330 may be electrically connected to the capacitors 123 and 125 by the lower through-electrodes 313, 323, and 333 included in the first to third lower semiconductor chips 310, 320, and 330 and the interposer through-electrode 110 and the redistribution pattern 130 included in the interposer 10.

The upper semiconductor stack structure 50 may include a first upper semiconductor chip 510, a second upper semiconductor chip 520 mounted on the first upper semiconductor chip 510, and a third upper semiconductor chip 530 mounted on the second upper semiconductor chip 520.

In an implementation, the first to third upper semiconductor chips 510, 520, and 530 may include a memory semiconductor chip. In an implementation, the first to third upper semiconductor chips 510, 520, and 530 may include a logic semiconductor chip.

In an implementation, as illustrated in the drawing, the upper semiconductor stack structure 50 may include three semiconductor chips, e.g., the first to third upper semiconductor chips 510, 520, and 530, or may include a different number of semiconductor chips in the upper semiconductor stack structure 50.

In an implementation, the first upper semiconductor chip 510 may include a semiconductor substrate 511 having an active layer AL_U1, an upper through-electrode 513, an upper pad 515, a lower pad 517, and a chip connection terminal 519.

The upper through-electrode 513 of the first upper semiconductor chip 510 may be connected to a plurality of individual devices in the active layer AL_U1 vertically through at least a portion of the semiconductor substrate 511.

In an implementation, the upper pad 515 may be on an upper surface of the semiconductor substrate 511 and connected to an upper portion of the upper through-electrode 513, and the lower pad 517 may be on a lower surface of the semiconductor substrate 511 and connected to a lower portion of the upper through-electrode 513.

The chip connection terminal 519 may be attached to the lower pad 517. In an implementation, the chip connection terminal 519 may be between the lower pad 517 of the first upper semiconductor chip 510 and the interposer upper pad 143 of the interposer 10.

As the first upper semiconductor chip 510 is mounted on the interposer 10, the individual devices in the active layer AL_U1 of the first upper semiconductor chip 510 may be electrically connected to the capacitors 123 and 125 in the interposer 10.

The second upper semiconductor chip 520 may include a semiconductor substrate 521 having an active layer AL_U2, an upper through-electrode 523, an upper pad 525, a lower pad 527, and a chip connection terminal 529.

In an implementation, the third semiconductor chip 330 may include a semiconductor substrate 331 having an active layer AL_U3, a lower pad 337, and a chip connection terminal 339.

In an implementation, the chip connection terminal 529 of the second upper semiconductor chip 520 may be between the lower pad 527 of the second upper semiconductor chip 520 and the upper pad 515 of the first upper semiconductor chip 510, and the chip connection terminal 539 of the third upper semiconductor chip 530 may be between the lower pad 537 of the third upper semiconductor chip 530 and the upper pad 525 of the second upper semiconductor chip 520. In an implementation, the first to third upper semiconductor chips 510, 520, and 530 may be electrically connected to each other.

In an implementation, the individual devices in the active layers AL_L1, AL_L2, and AL_L3 of the first to third lower semiconductor chips 310, 320, and 330 may be electrically connected to the capacitors 123 and 125 through the lower through-electrodes 313, 323, and 333 of the first to third lower semiconductor chips 310, 320, and 330, the interposer through-electrode 110 of the interposer 10, and the redistribution pattern 130.

In an implementation, the individual devices in the active layers AL_U1, AL_U2, and AL_U3 of the first to third upper semiconductor chips 510, 520, and 530 may be electrically connected to the capacitors 123 and 125 through the upper through-electrodes 513 and 523 of the first to third upper semiconductor chips 510, 520, and 530; the interposer through-electrode 110 of the interposer 10, and the redistribution pattern 130.

In an implementation, side surfaces of the first to third upper semiconductor chips 510, 520, and 530, a side surface of the interposer 10, and side surfaces of the first to third lower semiconductor chips 310, 320, and 330 may be coplanar (e.g., aligned) with each other.

The interposer 10 according to an example embodiment may be between the lower semiconductor stack structure 30 and the upper semiconductor stack structure 50, so that an electrical movement path between active layers AL_L1, AL_L2, and AL_L3 of the first to third lower semiconductor chips 310, 320, and 330 and the capacitors 123 and 125 and an electrical movement path between the active layers AL_U1, AL_U2, and AL_U3 of the first to third upper semiconductor chips 510, 520, and 530 and the capacitors 123 and 125 may be shortened. Accordingly, noise of the first to third lower semiconductor chips 310, 320, and 330 and the first to third upper semiconductor chips 510, 520, and 530 in a high frequency band may be improved.

Figure 6:
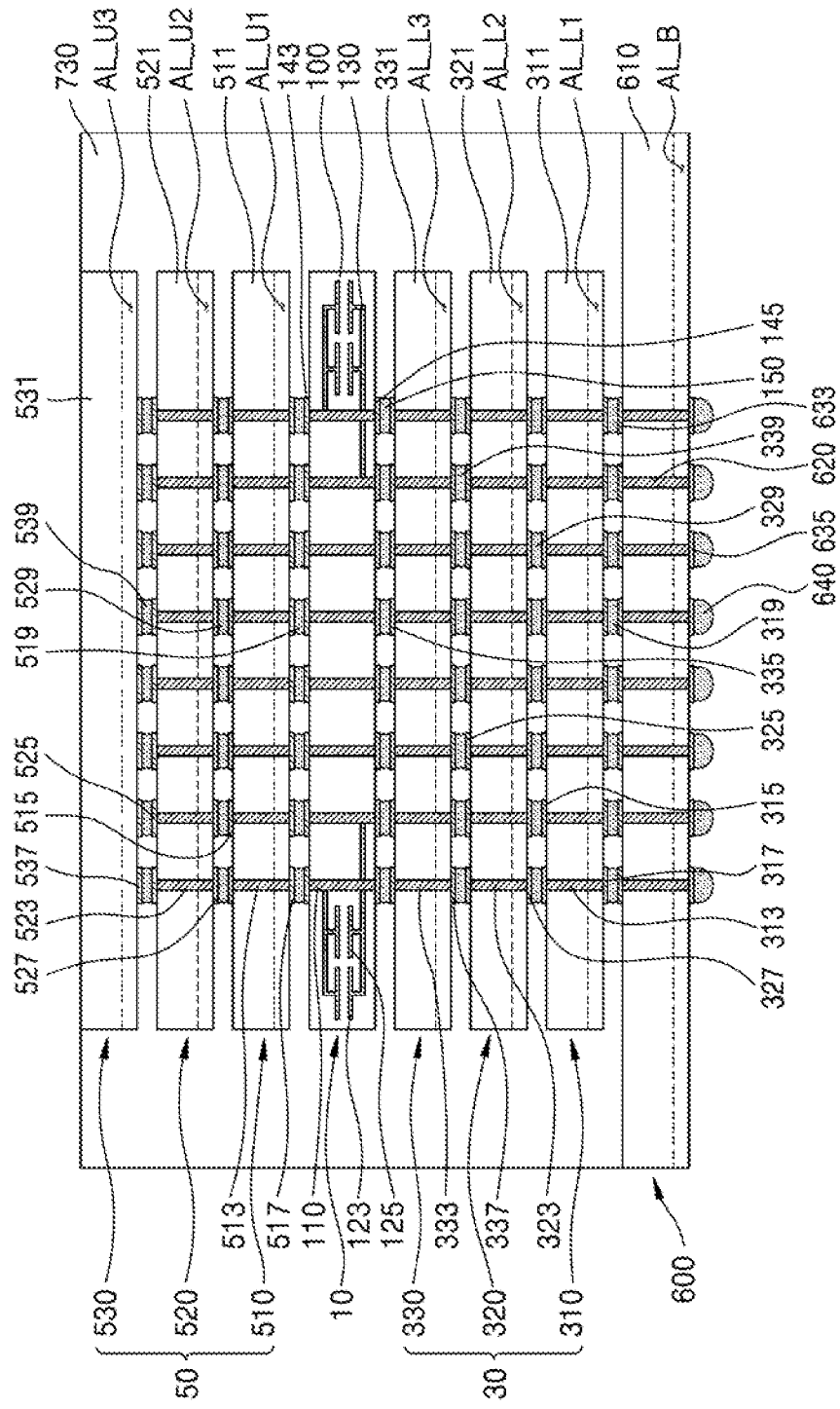
FIG. 6 is a cross-sectional view of a semiconductor device according to an example embodiment.

FIG. 6 is a cross-sectional view of a semiconductor device 2 according to an example embodiment.

Hereinafter, repeated descriptions of the semiconductor device 1 of FIG. 5 and the semiconductor device 2 of FIG. 6 may be omitted and differences therebetween may be mainly described.

The semiconductor device 2 of FIG. 6 may include a base semiconductor chip 600, a lower semiconductor stack structure 30, an upper semiconductor stack structure 50, an interposer 10, and a molding layer (e.g., a first molding layer) 730. The technical idea of the lower semiconductor stack structure 30, the upper semiconductor stack structure 50, and the interposer 10 of the semiconductor device 2 may be the same as that of description given above with reference to FIG. 5, and thus, a detailed description thereof may be omitted.

The base semiconductor chip 600 may be a semiconductor chip supporting the semiconductor device (1 of FIG. 5) formed by stacking the lower semiconductor stack structure 30, the interposer 10, and the upper semiconductor stack structure 50.

In an implementation, the base semiconductor chip 600 may include a buffer chip configured to serialize a data signal received from a memory semiconductor chip and transmit the serialized data signal to a logic semiconductor chip and parallelize a data signal received from the logic semiconductor chip and transmit the parallelized data signal to the memory semiconductor chip. In an implementation, the base semiconductor chip 600 may include a buffer chip having a serial-parallel conversion circuit.

The base semiconductor chip 600 may include a semiconductor substrate 610 having an active layer AL_B, a base through-electrode 620 electrically connected to the active layer AL_B vertically through at least a portion of the semiconductor substrate 610, an upper pad 633 connected to the base through-electrode 620 on an upper surface of the semiconductor substrate 610, a lower pad 635 on a lower surface of the semiconductor substrate 610, and a chip connection terminal 640 attached to the lower pad 635.

In an implementation, a horizontal length of the base semiconductor chip 600 may be greater than horizontal lengths of the first to third lower semiconductor chips 310, 320, and 330, the interposer 10, and the first to third upper semiconductor chips 510, 520, and 530.

In an implementation, in a plan view of the semiconductor device 2 of FIG. 6, a footprint of the base semiconductor chip 600 may be greater than a footprint of each of the first to third lower semiconductor chips 310, 320, and 330, the interposer 10, and the upper semiconductor chips 510, 520, and 530.

The upper pad 633 of the base semiconductor chip 600 may be in contact with the chip connection terminal 319 of the first lower semiconductor chip 310. In an implementation, the chip connection terminal 319 of the first lower semiconductor chip 310 may be between the lower pad 317 of the first lower semiconductor chip 310 and the upper pad 633 of the base semiconductor chip 600.

A plurality of individual devices in the active layer AL_B of the base semiconductor chip 600 may be electrically connected to the capacitors 123 and 125 through the lower through-electrodes 313, 323, and 333 of the lower semiconductor chips 310, 320, and 330, the interposer through-electrode 110 of the interposer 10, and the redistribution pattern 130.

The molding layer 730 may be a layer positioned on the base semiconductor chip 600 and surrounding the lower semiconductor stack structure 30, the interposer 10, and the upper semiconductor stack structure 50. In an implementation, the molding layer 730 may be a layer configured to fix the lower semiconductor stack structure 30, the interposer 10, and the upper semiconductor stack structure 50 on the base semiconductor chip 600.

In an implementation, the molding layer 730 may include a material of an epoxy molding compound (EMC). In an implementation, the material of the molding layer 730 may include various materials, e.g., an epoxy-based material, a thermosetting material, a thermoplastic material, a UV treatment material, or the like.

In an implementation, the molding layer 730 may cover sides of the lower semiconductor stack structure 30, the interposer 10, and the upper semiconductor stack structure 50. In an implementation, an upper surface of the molding layer 730 may be coplanar with an upper surface of the third upper semiconductor chip 530 of the upper semiconductor stack structure 50. In an implementation, the upper surface of the molding layer 730 may be coplanar with the upper surface of the third upper semiconductor chip 530, and the semiconductor device 3 may be thin and light in weight. In an implementation, a level of the upper surface of the molding layer 730 may be higher than a level of an upper surface of the third semiconductor chip 530, and the molding layer 730 is the upper surface of the third semiconductor chip 530.

Figure 7:
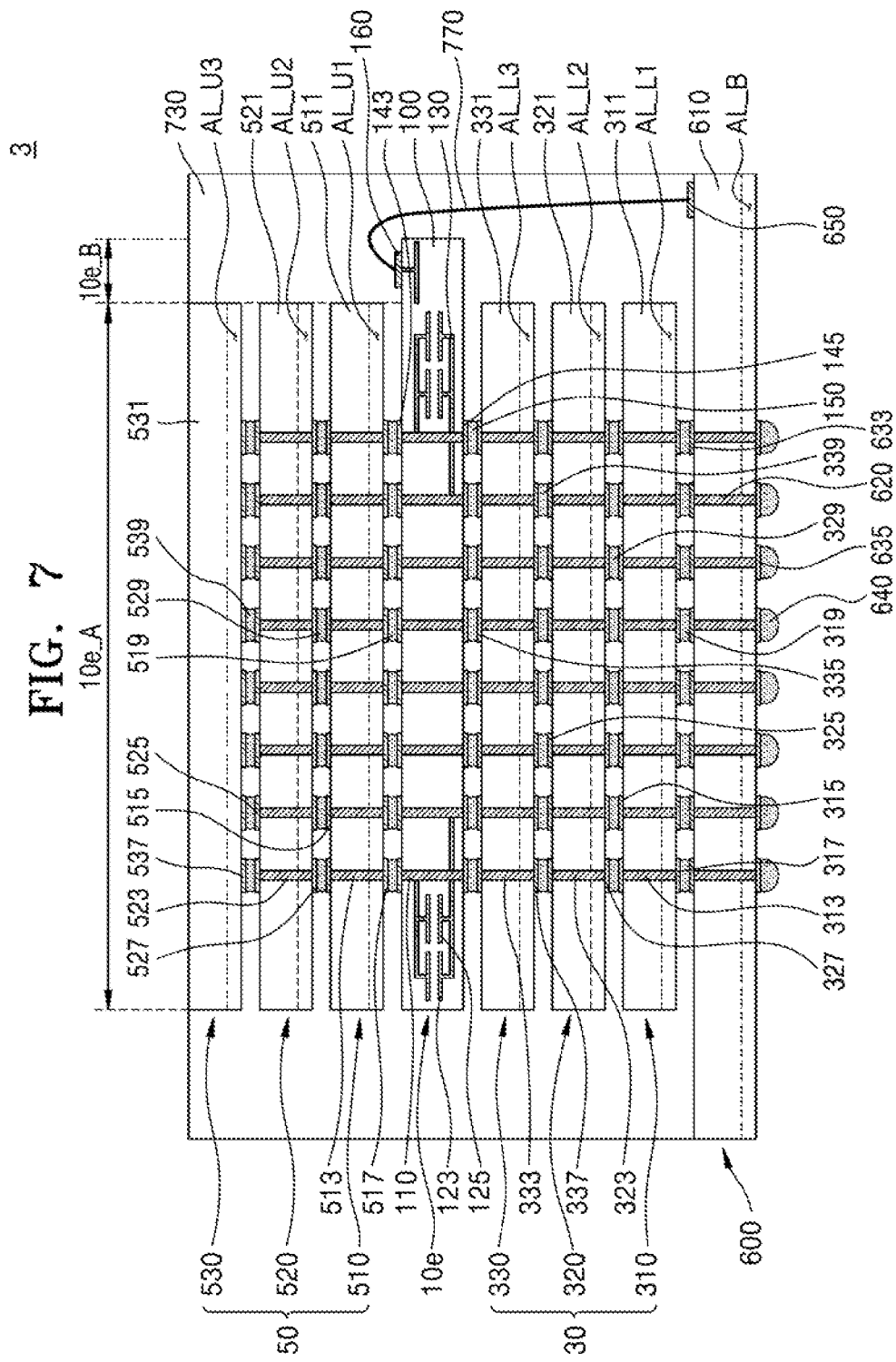
FIG. 7 is a cross-sectional view of a semiconductor device according to an example embodiment.

FIG. 7 is a cross-sectional view of a semiconductor device 3 according to an example embodiment.

Hereinafter, repeated descriptions of the semiconductor device 2 of FIG. 6 and the semiconductor device 3 of FIG. 7 may be omitted and differences therebetween may be mainly described.

The semiconductor device 3 of FIG. 7 may include a base semiconductor chip 600, a lower semiconductor stack structure 30, an upper semiconductor stack structure 50, an interposer 10e, a molding layer 730, and a conductive wire 770.

The interposer 10e may include an interposer substrate 100, an interposer through-electrode 110, capacitors 123 and 125, a redistribution pattern 130, an interposer upper pad 143, an interposer lower pad 145, an interposer connection terminal 150, and a first wire bonding pad 160.

In an implementation, a horizontal length of the interposer 10e may be greater than a horizontal length of each of the lower semiconductor chips 310, 320, and 330 and the upper semiconductor chips 510, 520, and 530. In an implementation, a horizontal length of the interposer 10e may be shorter than a horizontal length of the base semiconductor chip 600.

In an implementation, a first region 10e_A of the interposer 10e may be a region of the interposer 10e vertically overlapping the lower semiconductor stack structure 30 and the upper semiconductor stack structure 50. In an implementation, a second region 10e_B of the interposer 10e may be a region of the interposer 10e protruding from or beyond a side surface of the lower semiconductor stack structure 30 and the upper semiconductor stack structure 50 (e.g., in the horizontal direction), rather than overlapping or overlying the lower semiconductor stack structure 30 and the upper semiconductor stack structure 50 in the vertical direction.

In an implementation, one side surface of the interposer 10e may be on or extend beyond an outer side of one side surface of the lower semiconductor stack structure 30 and the upper semiconductor stack structure 50. In an implementation, the other side surface of the interposer 10e may be coplanar with the other side surface of the lower semiconductor stack structure 30 and the upper semiconductor stack structure 50.

The first wire bonding pad 160 may be on the second region 10e_B of the interposer 10e. In an implementation, the first wire bonding pad 160 may be a pad for connecting the conductive wire 770.

In an implementation, the first wire bonding pad 160 may be connected to the redistribution pattern 130. In an implementation, the first wire bonding pad 160 may be electrically connected to the interposer through-electrode 110 or the capacitors 123 and 125 through the redistribution pattern 130.

In an implementation, the base semiconductor chip 600 may include a second wire bonding pad 650. The second wire bonding pad 650 may be at an edge portion of the base semiconductor chip 600. In an implementation, the second wire bonding pad 650 may be positioned on or at an outer side of (e.g., outward relative to) the side surface of the interposer 10e.

In an implementation, the second wire bonding pad 650 may be electrically connected to the individual devices in the active layer AL_B through an interconnection pattern inside the semiconductor substrate 610 of the base semiconductor chip 600.

The conductive wire 770 may connect the first wire bonding pad 160 to the second wire bonding pad 650. In an implementation, the conductive wire 770 may include copper (Cu). In an implementation, the material of the conductive wire 770 may be a metal, e.g., nickel (Ni), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), or ruthenium (Ru), or an alloy thereof.

In an implementation, the interposer 10e may be electrically connected to the base semiconductor chip 600 through the conductive wire 770. In an implementation, the active layer AL_B of the base semiconductor chip 600 may be electrically connected to the capacitors 123 and 125 of the interposer 10e through the conductive wire 770.

In the semiconductor device 3 according to an example embodiment, the base semiconductor chip 600 may be electrically connected to the interposer 10e through the conductive wire 770. Accordingly, an electrical movement path between the base semiconductor chip 600 and the capacitors 123 and 125 of the interposer 10e may be shortened.

Figure 8:
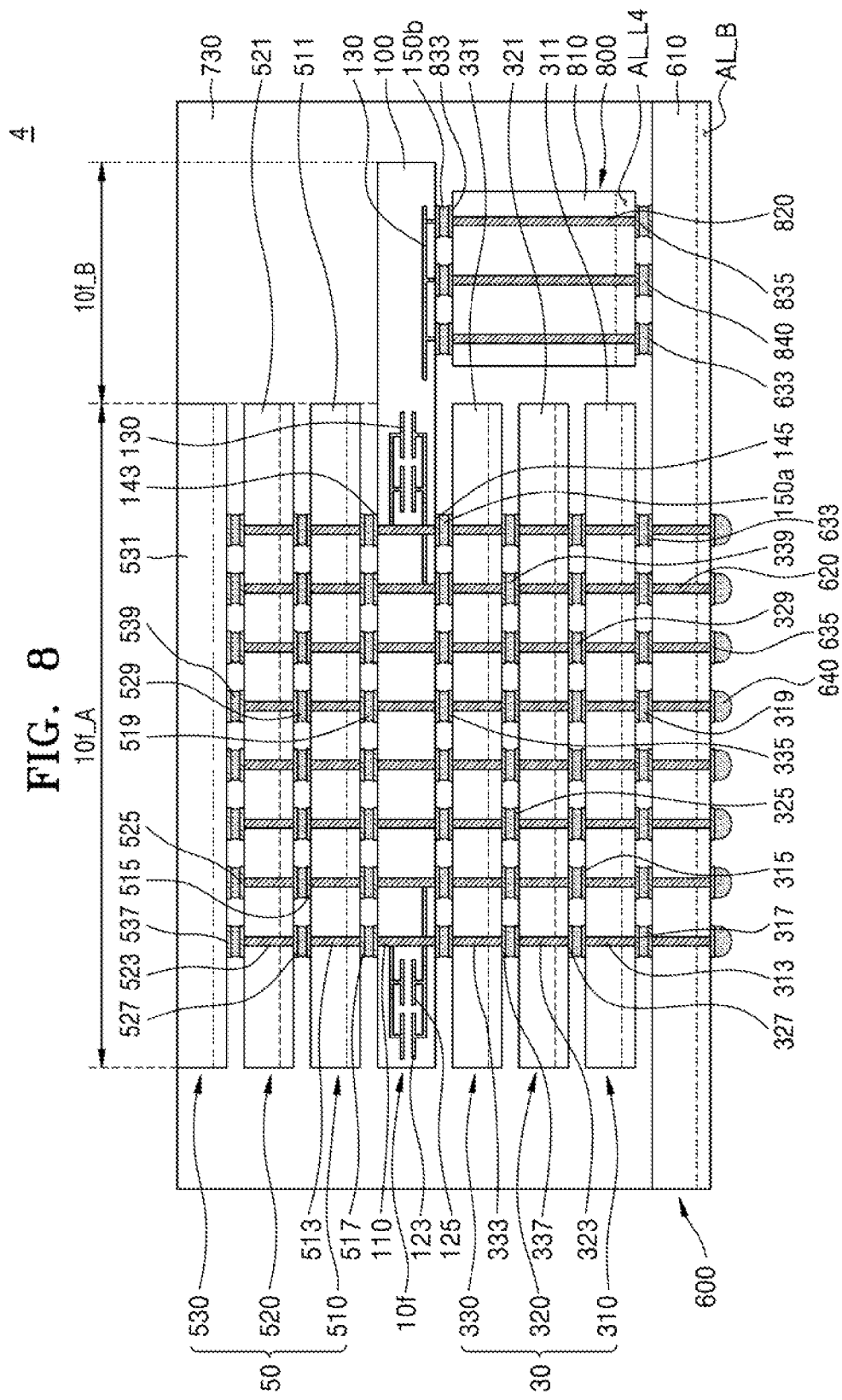
FIG. 8 is a cross-sectional view of a semiconductor device according to an example embodiment.

FIG. 8 is a cross-sectional view of a semiconductor device 4 according to an example embodiment.

Hereinafter, repeated descriptions of the semiconductor device 3 of FIG. 7 and the semiconductor device 4 of FIG. 8 may be omitted and differences therebetween may be mainly described.

The semiconductor device 4 of FIG. 8 may include a base semiconductor chip 600, a lower semiconductor stack structure 30, an upper semiconductor stack structure 50, an interposer 10f, a molding layer 730, and a fourth lower semiconductor chip 800.

A horizontal length of the interposer 10f may be greater than a horizontal length of each of the lower semiconductor chips 310, 320, and 330 and the upper semiconductor chips 510, 520, and 530. In an implementation, a horizontal length of the interposer 10f may be shorter than a horizontal length of the base semiconductor chip 600.

In an implementation, a first region 10f_A of the interposer 10f may be a region of the interposer 10f vertically overlapping the lower semiconductor stack structure 30 and the upper semiconductor stack structure 50 in the vertical direction. In an implementation, a second region 10f_B of the interposer 10f may be a region of the interposer 10f protruding from or beyond side surfaces of the lower semiconductor stack structure 30 and the upper semiconductor stack structure 50, rather than overlapping the lower semiconductor stack structure 30 and the upper semiconductor stack structure 50 in the vertical direction.

In an implementation, the interposer 10f may include a first interposer connection terminal 150a in the first region 10f_A and electrically connecting the interposer 10f to the lower semiconductor stack structure 30.

In an implementation, the interposer 10f may include a second interposer connection terminal 150b in the second region 10f_B and electrically connecting the interposer 10f to the fourth lower semiconductor chip 800.

The fourth lower semiconductor chip 800 may be a semiconductor chip on a lower portion of the second region 10f_B of the interposer 10f and electrically connected to the interposer 10f. In an implementation, the fourth lower semiconductor chip 800 may be a high bandwidth memory (HBM) DRAM semiconductor chip.

In an implementation, the fourth lower semiconductor chip 800 may include a semiconductor substrate 810 having an active layer AL_L4, a lower through-electrode 820 connected to the active layer AL_L4 vertically through at least a portion of the semiconductor substrate 810, an upper pad 833 on an upper surface of the semiconductor substrate 810 and connected to the lower through-electrode 820, a lower pad 835 on a lower surface of the semiconductor substrate 810, and a chip connection terminal 840 attached to the lower pad 835.

In an implementation, the interposer connection terminal 150b of the interposer 10f may be between the interposer lower pad 145 of the interposer 10f and the upper pad 833 of the fourth lower semiconductor chip 800, and may electrically connect the interposer 10f to the fourth lower semiconductor chip 800.

In an implementation, the interposer connection terminal 150b may be electrically connected to the capacitors 123 and 125 through the interposer lower pad 145 and the redistribution pattern 130.

In an implementation, the chip connection terminal 840 of the fourth lower semiconductor chip 800 may be between the lower pad 835 of the fourth lower semiconductor chip 800 and the upper pad 633 of the base semiconductor chip 600 and may electrically connect the fourth lower semiconductor chip 800 to the base semiconductor chip 600.

In an implementation, the individual devices in the active layer AL_L4 of the fourth lower semiconductor chip 800 may be electrically connected to the capacitors 123 and 125 through the lower through-electrode 820 of the fourth lower semiconductor chip 800 and the redistribution pattern 130 of the interposer 10f.

In an implementation, the fourth lower semiconductor chip 800 may be a memory semiconductor chip. In an implementation, the fourth lower semiconductor chip 800 may be a logic semiconductor chip.

In an implementation, a vertical length of the fourth lower semiconductor chip 800 may be greater than a vertical length of each of the first to third lower semiconductor chips 310, 320, and 330 included in the lower semiconductor stack structure 30. In an implementation, the vertical length of the fourth lower semiconductor chip 800 may be substantially equal to the sum of the vertical lengths of each of the first to third lower semiconductor chips 310, 320, and 330.

Figure 9:
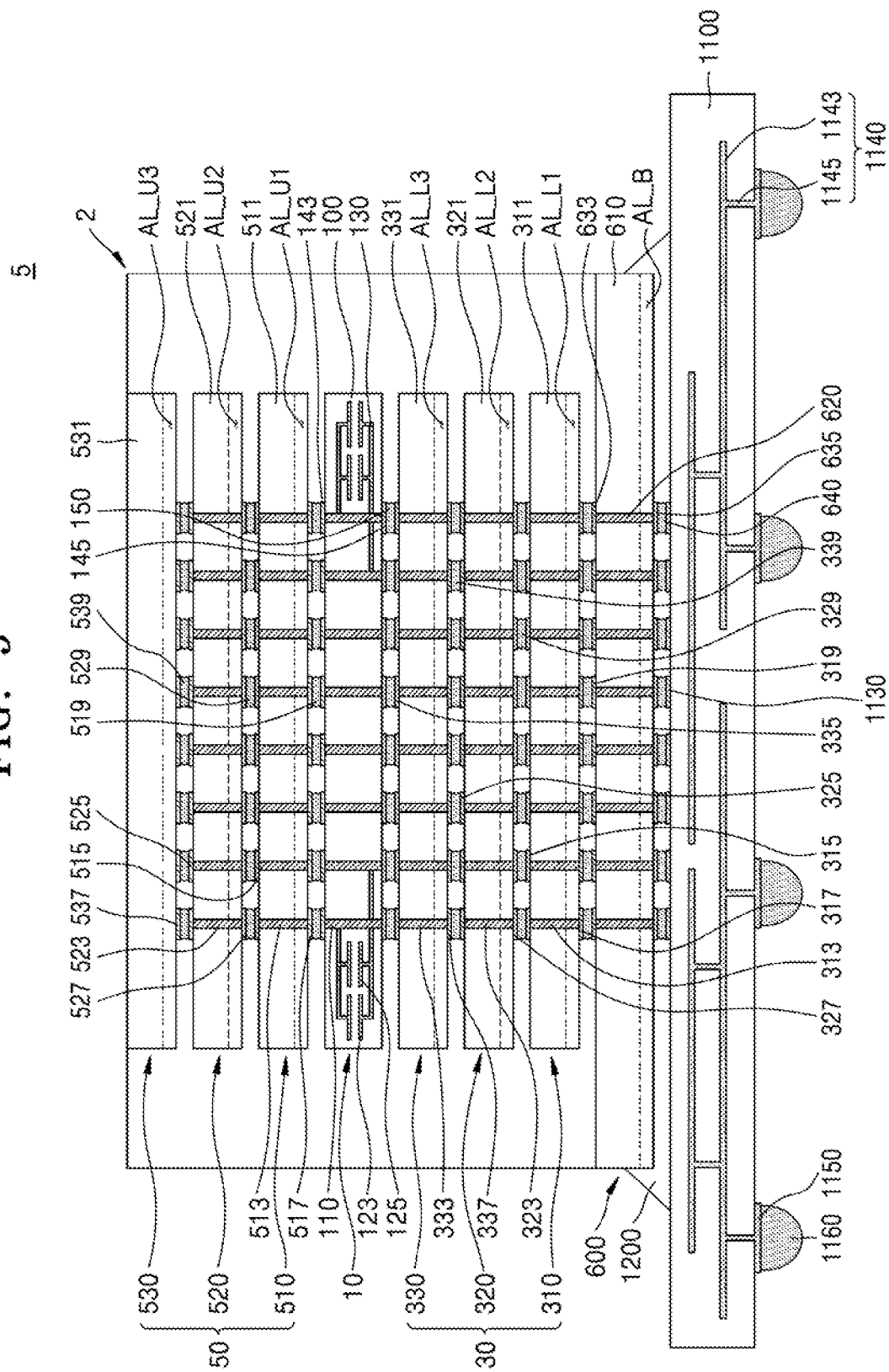
FIG. 9 is a cross-sectional view of a semiconductor package according to an example embodiment.
Figure 10:
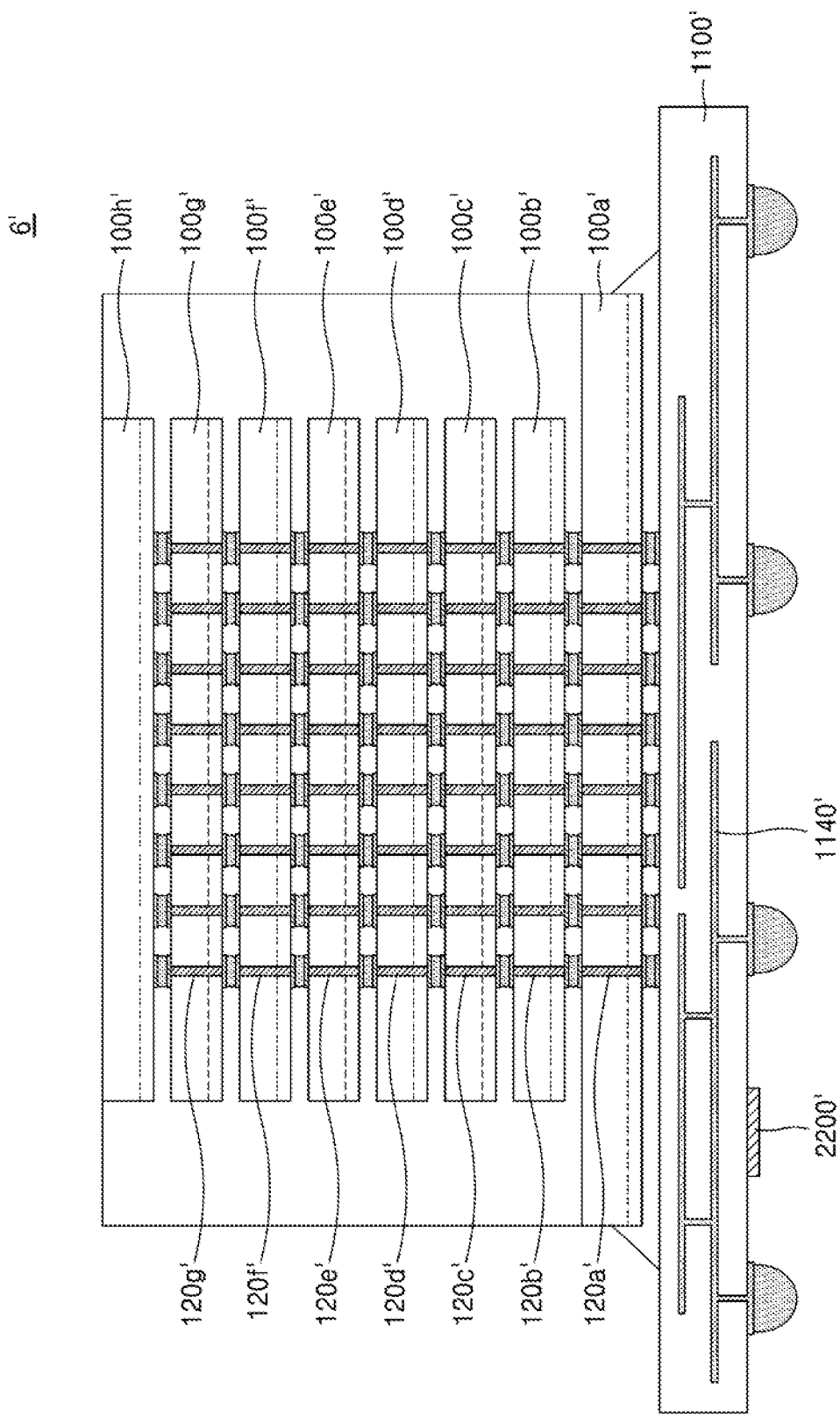
FIG. 10 is a cross-sectional view of a semiconductor package according to a Comparative Example.

FIG. 9 is a cross-sectional view of a semiconductor package 5 according to an example embodiment, and FIG. 10 is a cross-sectional view of a semiconductor package 6' according to a Comparative Example.

Referring to FIG. 9, the semiconductor package 5 according to an example embodiment may include a package substrate 1100, a semiconductor device 2 mounted on the package substrate 1100, and an underfill member 1200 configured to fix the semiconductor device 2 on the package substrate 1100. The semiconductor device 2 may be the same as the semiconductor device 2 described above with reference to FIG. 6, and thus, repeated descriptions thereof may be omitted.

The package substrate 1100 may be a substrate allowing the semiconductor device 2 to be mounted thereon and connecting the semiconductor device 2 to an external device. In an implementation, the package substrate 1100 may be a double-sided printed circuit board (PCB) including a first package substrate pad 1130 and a second package substrate pad 1150. In an implementation, the package substrate 1100 may be a single-sided PCB including the first package substrate pad 1130 only on one surface thereof.

In an implementation, the package substrate 1100 may be limited in structure and material of the PCB, and may include various types of substrates such as a ceramic substrate.

In an implementation, the package substrate 1100 may include an interconnection pattern 1140 electrically connecting the first package substrate pad 1130 to the second package substrate pad 1150. The interconnection pattern 1140 may include an interconnection line pattern 1143 extending in the horizontal direction inside the package substrate 1100 and an interconnection via pattern 1145 extending in the vertical direction inside the package substrate 1100.

A package connection terminal 1160 may be a connection terminal attached to the second package substrate pad 1150 and connecting the semiconductor package 5 to an external device. In an implementation, the package connection terminal 1160 may be a solder ball including a metal material including, e.g., tin (Sn), silver (Ag), copper (Cu), or aluminum (Al).

The underfill member 1200 may be between the semiconductor device 2 and the package substrate 1100 to fix the semiconductor device 2 on the package substrate 1100.

In an implementation, a portion of the underfill member 1200 may be between the base semiconductor chip 600 and the package substrate 1100. In an implementation, a portion of the underfill member 1200 may surround a portion of a side surface of the base semiconductor chip 600.

In an implementation, the underfill member 1200 may include, e.g., an insulating polymer or an epoxy resin. In an implementation, the underfill member 1200 may include an EMC.

In an implementation, as illustrated in FIG. 9, the semiconductor device 2 of FIG. 6 may be mounted on the package substrate 1100. In an implementation, the semiconductor device 3 described above with reference to FIG. 7 or the semiconductor device 4 described above with reference to FIG. 8 may be mounted on the package substrate 1100.

Referring to FIG. 10, the semiconductor package 6' according to the

Comparative Example may include a package substrate 1100', a capacitor 2200' attached to a lower surface of the package substrate 1100', and a plurality of semiconductor chips 100a' to 100h' mounted on an upper surface of the package substrate 1100'.

The semiconductor chips 100a' to 100h' of the semiconductor package 6' according to the Comparative Example may be electrically connected to each other through through-electrodes 120a' to 120g'. In addition, the semiconductor chips 100a' to 100h' may be electrically connected to the capacitor 2200' attached on the lower surface of the package substrate 1100' through the through-electrodes 120a' to 120g' and the interconnection pattern 1140' of the package substrate 1100'.

At this time, an electrical movement path between the semiconductor chips 100g' and 100h' positioned on a relatively high level, among the semiconductor chips 100a' to 100h', and the capacitor 2200' may be longer than an electrical movement path between the semiconductor chips 100a' and 100b' positioned on a relatively low level, among the semiconductor chips 100a' to 100h', and the capacitor 2200'.

Accordingly, noise of the semiconductor chips 100g' and 100h' at the relatively high level in a high frequency band more frequently occur than noise of the semiconductor chips 100a' and 100b' positioned on the relatively low level.

Referring back to FIG. 9, the semiconductor package 5 according to an example embodiment may include an interposer 10 between the lower semiconductor stack structure 30 and the upper semiconductor stack structure 50 and having capacitors 123 and 125 therein.

The electrical movement path between the semiconductor chips 520 and 530 at a relatively high level, among the semiconductor chips 310, 320, 330, 510, 520, and 530 of FIG. 9, and the capacitors 123 and 125 may be shorter than the electrical movement path between the semiconductor chips 100g' and 100h' at a relatively high level, among the semiconductor chips 100a' to 100h', and the capacitors 123 and 125.

In an implementation, the interposer 10 (including the capacitors 123 and 125) may be between the lower semiconductor stack structure 30 and the upper semiconductor stack structure 50, and the electrical movement path between the semiconductor chips 520 and 530 at a relatively high level, among the semiconductor chips 310, 320, 330, 510, 520, and 530, and the capacitors 123 and 125 may be shortened, and noise of the semiconductor chips 520 and 530 in a high frequency band may be reduced from occurring.

In an implementation, a length of the electrical movement path between the semiconductor chips 520 and 530 at a relatively high level, among the semiconductor chips 310, 320, 330, 510, 520, and 530, and the capacitors 123 and 125 may be substantially the same as or similar to a length of the electrical movement path between the semiconductor chips 310 and 320 at a relatively high level, among the semiconductor chips 310, 320, 330, 510, 520, and 530, and the capacitors 123 and 125.

Accordingly, operating performance of the semiconductor chips 520 and 530 at a relatively high level and operating performance of the semiconductor chips 310 and 320 at a relatively low level may be uniform.

Figure 11:
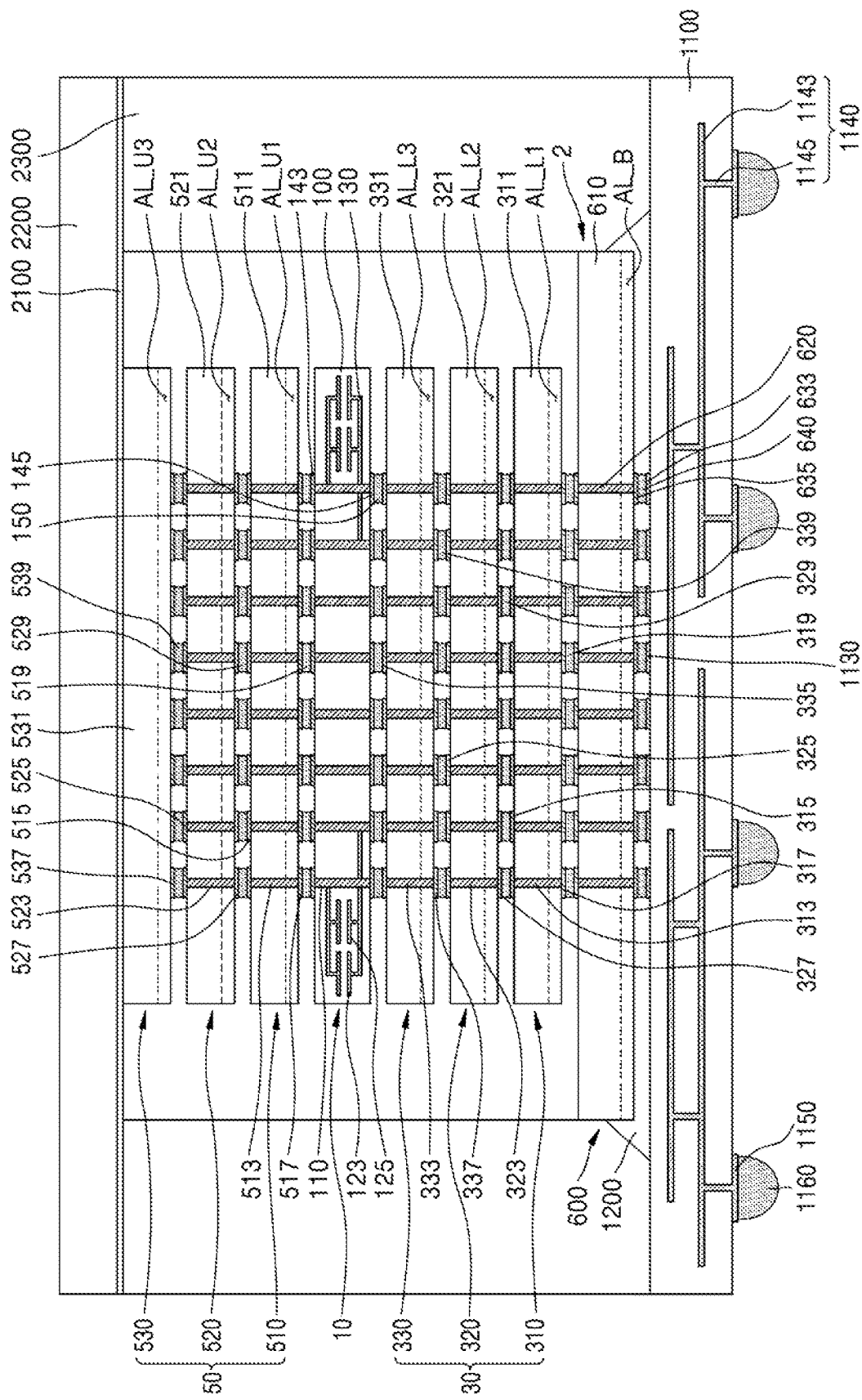
FIG. 11 is a cross-sectional view of a semiconductor package according to an example embodiment.

FIG. 11 is a cross-sectional view of a semiconductor package 7 according to an example embodiment.

Hereinafter, repeated descriptions of the semiconductor package 5 of FIG. 9 and the semiconductor package 7 of FIG. 11 may be omitted and differences therebetween may be mainly described.

Referring to FIG. 11, a second molding layer 2300 of the semiconductor package 7 may surround the side of the first molding layer 730 on the package substrate 1100. In an implementation, the second molding layer 2300 may include a material of an EMC. In an implementation, the material of the second molding layer 2300 may include various materials, e.g., an epoxy-based material, a thermosetting material, a thermoplastic material, a UV treatment material, or the like.

In an implementation, the material of the first molding layer 730 and the material of the second molding layer 2300 may be substantially the same. In an implementation, both materials of the first molding layer 730 and the second molding layer 2300 may be EMCs. In an implementation, the material of the first molding layer 730 may be different from the second molding layer 2300.

In an implementation, an upper surface of the second molding layer 2300 may be coplanar with an upper surface of the first molding layer 730 and an upper surface of the third upper semiconductor chip 530. In an implementation, the upper surface of the second molding layer 2300 may be on a level higher than levels of the upper surface of the first molding layer 730 and the upper surface of the third upper semiconductor chip 530, and the second molding layer 2300 may cover the upper surface of the first molding layer 730 and the upper surface of the third upper semiconductor chip 530.

A heat sink 2200 may be on the first molding layer 730 and the second molding layer 2300 and may be configured to dissipate heat generated by the semiconductor chips included in the semiconductor device 2 to the outside.

In an implementation, the heat sink 2200 may include a metal material having excellent thermal conductivity. In an implementation, the heat sink 2200 may include a ceramic material, a carbon material, or a polymer material.

In an implementation, in order to help improve heat dissipation performance of the semiconductor package 7, the heat sink 220 may have a concavo-convex structure in which concavities and convexities are repeated.

In an implementation, the heat sink 220 may be fixed on the second molding layer 2300 by an adhesive film 2100. In an implementation, the adhesive film 2100 may have adhesive properties by itself, and may be attached to a separate thermally conductive adhesive tape and provided. In an implementation, the adhesive tape may be a double-sided adhesive tape.

FIGS. 12 to 16 are views of stages in a method of manufacturing a semiconductor package according to an example embodiment. Hereinafter, a method of manufacturing a semiconductor package according to an example embodiment is described in detail. Also, the method of manufacturing a semiconductor package according to the example embodiment may be a method of manufacturing the semiconductor package 5 described above with reference to FIG. 9.

The method of manufacturing the semiconductor package 5 according to an example embodiment may include mounting a lower semiconductor stack structure 30 on a base semiconductor chip 600, mounting an interposer 10 on the lower semiconductor stack structure 30, mounting an upper semiconductor stack structure 50 on the interposer 10, forming a molding layer 730, and mounting a semiconductor device (2 in FIG. 6) on a package substrate 1100.

Figure 12:
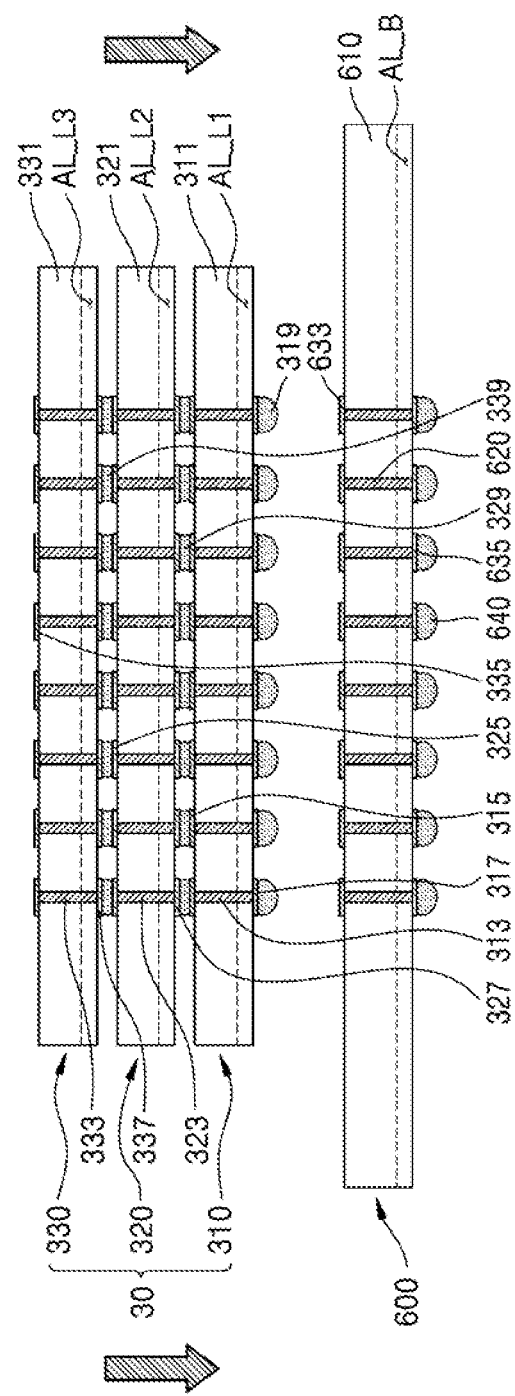
FIGS. 12 to 16 are views of stages in a method of manufacturing a semiconductor package according to an example embodiment.

FIG. 12 is a view of an operation of mounting the lower semiconductor stack structure 30 on the base semiconductor chip 600.

Referring to FIG. 12, the method of manufacturing the semiconductor package 5 according to the example embodiment may include mounting the lower semiconductor stack structure 30 on the base semiconductor chip 600.

The lower semiconductor stack structure 30 may be a structure in which first to third lower semiconductor chips 310, 320, and 330 are sequentially stacked. In an implementation, the first to third lower semiconductor chips 310, 320, and 330 may be electrically connected to each other through lower through-electrodes 313, 323, and 333. In an implementation, the first to third lower semiconductor chips 310, 320, and 330 may be electrically connected to each other through flip-chip bonding.

In an implementation, the lower semiconductor stack structure 30 may be mounted on the base semiconductor chip 600 so that the upper pad 633 of the base semiconductor chip 600 is in contact with a chip connection terminal 319 of the first lower semiconductor chip 310.

Figure 13:
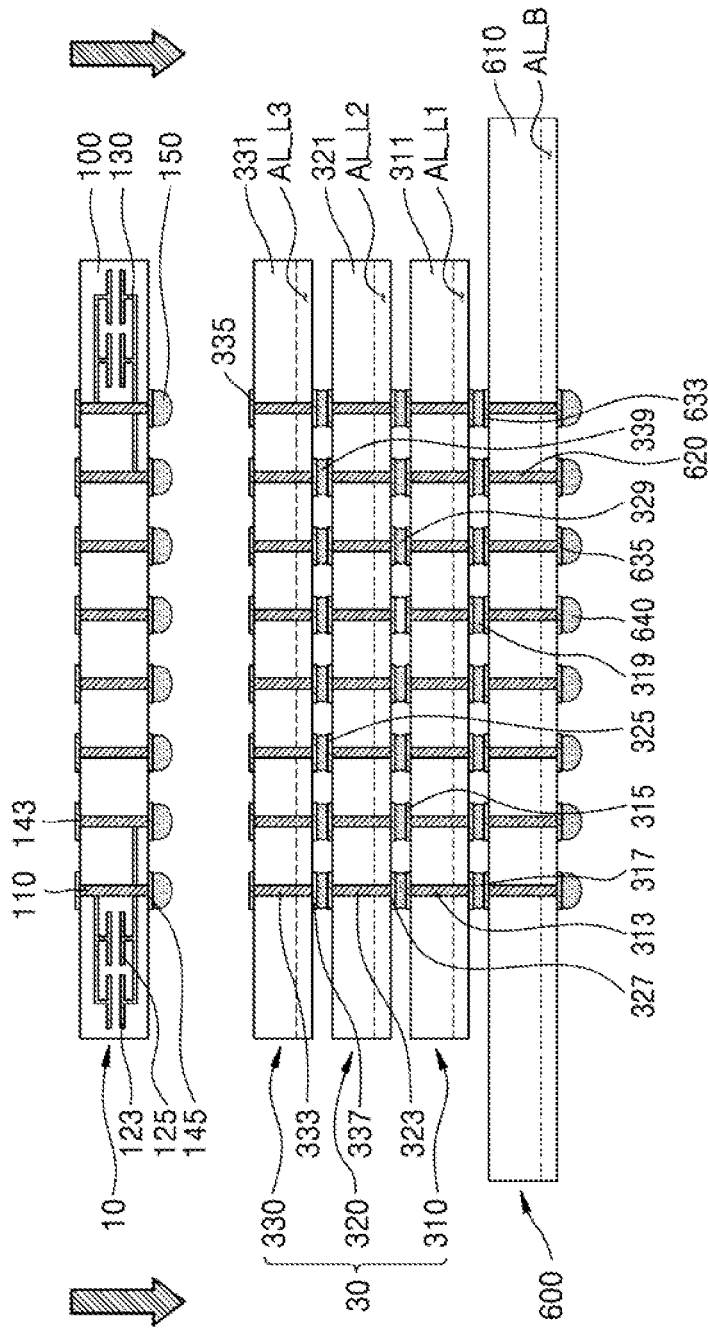

FIG. 13 is a view of an operation of mounting the interposer 10 on the lower semiconductor stack structure 30.

Referring to FIG. 13, the method of manufacturing the semiconductor package 5 according to the example embodiment may include mounting the interposer 10 on the lower semiconductor stack structure 30.

The interposer 10 may include one of the interposers 10a to 10d described above with reference to FIGS. 1 to 4. In an implementation, the interposer 10 of FIG. 13 may include, e.g., the interposer 10b described above with reference to FIG. 2, or a different type of interposer 10.

In an implementation, the interposer 10 may be mounted on the lower semiconductor stack structure 30 so that the upper pad 335 of the third lower semiconductor chip 330 of the lower semiconductor stack structure 30 is in contact with the interposer connection terminal 150 of the interposer 10.

In an implementation, the base semiconductor chip 600 and the first to third lower semiconductor chips 310, 320, and 330 may be connected to the interposer 10 through the lower through-electrodes 313, 323, and 333 and the base through-electrode 620. In an implementation, the base semiconductor chip 600 and the first to third lower semiconductor chips 310, 320, and 330 may be electrically connected to the capacitors 123 and 125 inside the interposer substrate 100 through the lower through-electrodes 313, 323, and 333, the base through-electrode 620, the interposer through-electrode 110, and the redistribution pattern 130.

Figure 14:
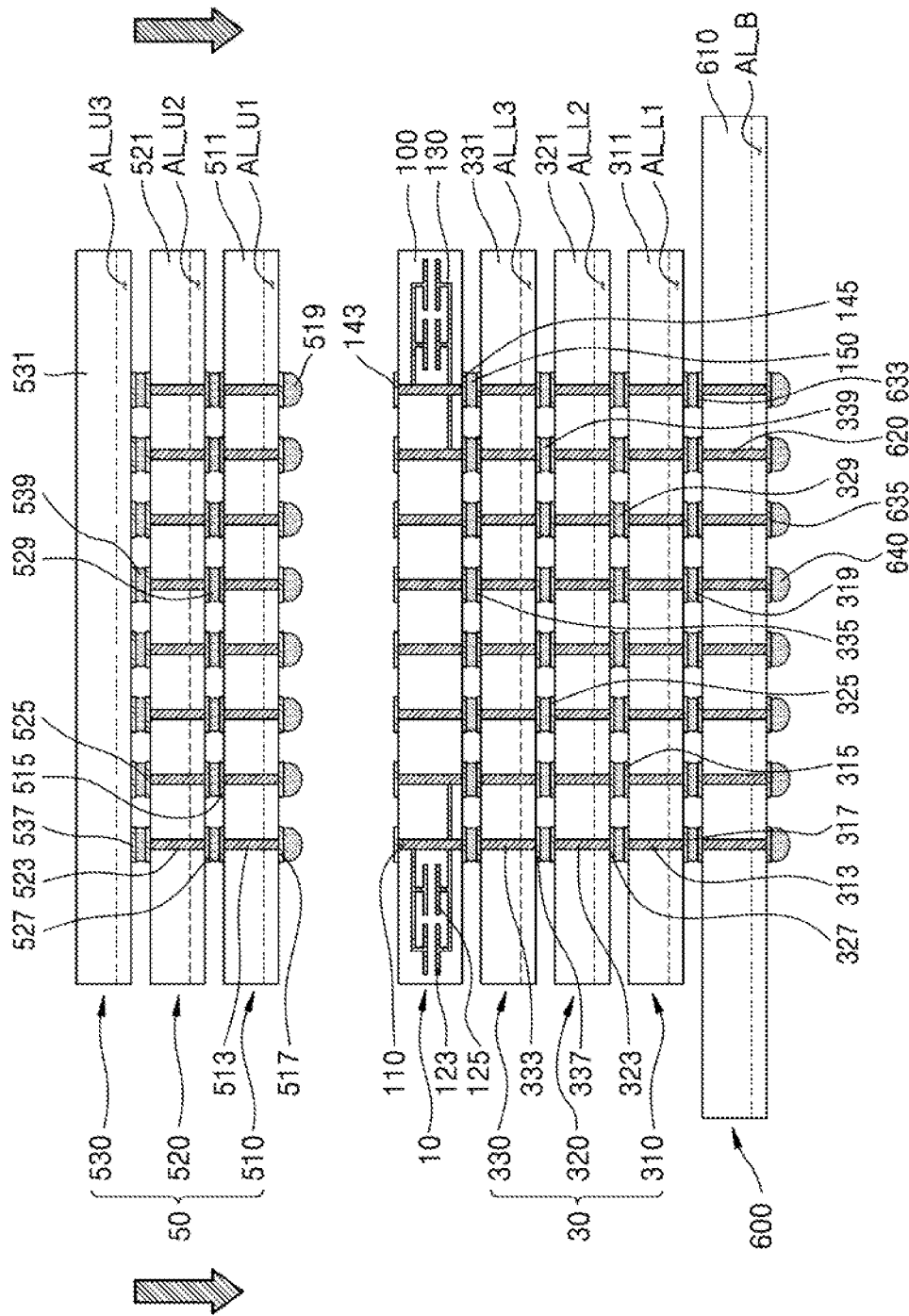

FIG. 14 is a view of an operation of mounting the upper semiconductor stack structure 50 on the interposer 10.

Referring to FIG. 14, the method of manufacturing the semiconductor package 5 according to an example embodiment may include mounting the upper semiconductor stack structure 50 on the interposer 10.

The upper semiconductor stack structure 50 may be a structure in which first to third upper semiconductor chips 510, 520, and 530 are sequentially stacked. Also, the first to third upper semiconductor chips 510, 520, and 530 may be electrically connected to each other through upper through-electrodes 513 and 523. For example, the first to third upper semiconductor chips 510, 520, and 530 may be electrically connected to each other through flip-chip bonding.

In an implementation, the upper semiconductor stack structure 50 may be mounted on the interposer 10 so that the interposer upper pad 143 of the interposer 10 is in contact with the chip connection terminal 519 of the first upper semiconductor chip 510.

In an implementation, the first to third upper semiconductor chips 510, 520, and 530 may be connected to the interposer 10 through the upper through-electrodes 513 and 523. In an implementation, the first to third upper semiconductor chips 510, 520, and 530 may be electrically connected to the capacitors 123 and 125 inside the interposer substrate 100 through the upper through-electrodes 513 and 523, the interposer through-electrode 110, and the redistribution pattern 130.

Figure 15:
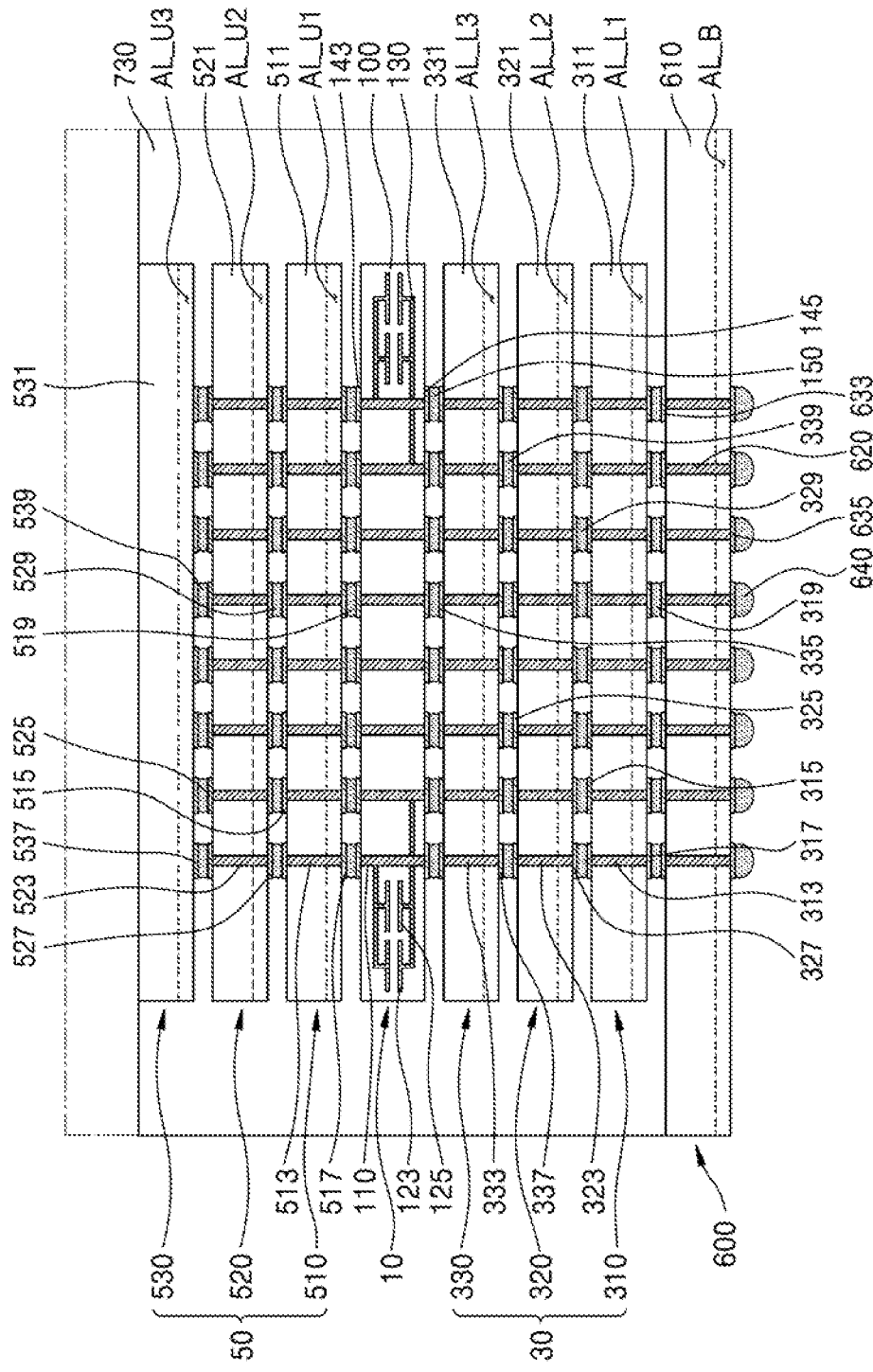

FIG. 15 is a view of an operation of forming the molding layer 730 on the base semiconductor chip 600.

Referring to FIG. 15, a method of manufacturing the semiconductor package 5 according to an example embodiment may include forming the molding layer 730 on the base semiconductor chip 600.

In an implementation, forming the molding layer 730 may include forming the molding layer 730 on the base semiconductor chip 600 to cover sides of the lower semiconductor stack structure 30, the interposer 10, and the upper semiconductor stack structure 50. In an implementation, the molding layer 730 may include a material of EMC.

In an implementation, the forming of the molding layer 730 may include removing an upper portion of the molding layer 730. In an implementation, the upper portion of the molding layer 730 may be removed through a grinding process. In an implementation, the upper portion of the molding layer 730 may be removed through the grinding process so that the upper surface of the molding layer 730 and the upper surface of the upper semiconductor stack structure 50 are coplanar. In an implementation, the operation of removing the upper portion of the molding layer 730 through the grinding process may be omitted.

By performing the operations described above with reference to FIGS. 12 to 15, the semiconductor device 2 described above with reference to FIG. 6 may be manufactured.

Figure 16:
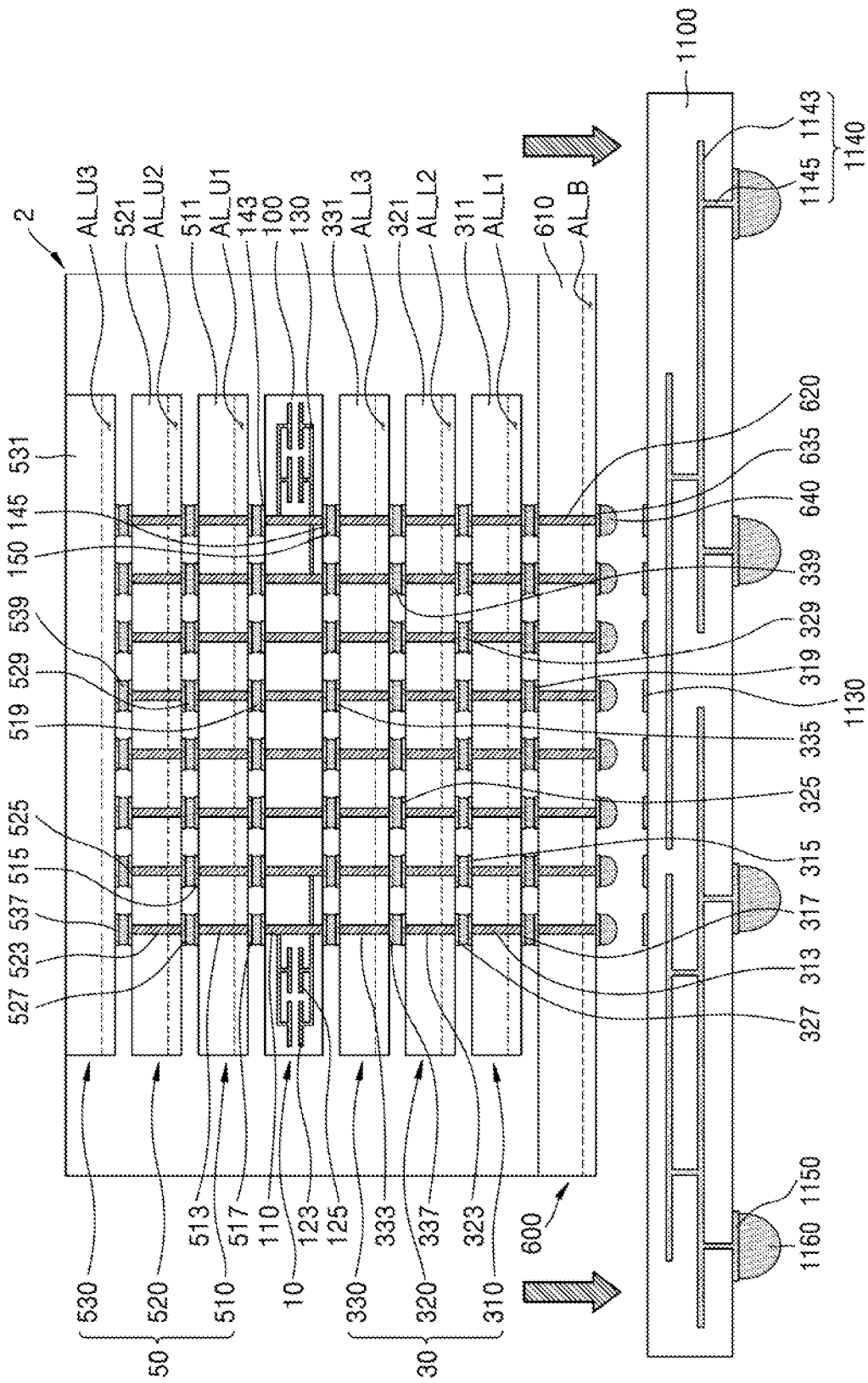

FIG. 16 is a view of an operation of mounting the semiconductor device 2 on the package substrate 1100.

Referring to FIG. 16, a method of manufacturing a semiconductor package 5 according to an example embodiment may include mounting the semiconductor device 2 on the package substrate 1100.

In an implementation, the semiconductor device 2 may be mounted on the package substrate 1100 so that the chip connection terminal 640 of the base semiconductor chip 600 of the semiconductor device 2 is in contact with the first package substrate pad 1130 of the package substrate 1100.

In an implementation, in order to fix the semiconductor device 2 on the package substrate 1100, an operation of injecting the underfill member 1200 into a space between the semiconductor device 2 and the package substrate 1100 may be performed.

The semiconductor package 5 manufactured by the method of manufacturing a semiconductor package according to an example embodiment may include the interposer 10 between the lower semiconductor stack structure 30 and the upper semiconductor stack structure 50. In an implementation, the interposer 10 may include capacitors 123 and 125 inside the interposer substrate 100 and electrically connected to the lower semiconductor stack structure 30 and the upper semiconductor stack structure 50.

In an implementation, the interposer 10 including the capacitors 123 and 125 may be between the lower semiconductor stack structure 30 and the upper semiconductor stack structure 50, an electrical movement path between the semiconductor chips 520 and 530 positioned on a relatively high level, among the semiconductor chips 310, 320, 330, 510, 520, and 530, included in the semiconductor package 5, and the capacitors 123 and 125 may be shortened, and noise of the semiconductor chips 520 and 530 in a high frequency band may be reduced.

By way of summation and review, improving an operating rate of semiconductor chips and improving noise of semiconductor chips in a high frequency band has been considered.

One or more embodiments may provide a semiconductor package including an interposer.

One or more embodiments may provide a semiconductor package in which noise of semiconductor chips is reduced from occurring.

One or more embodiments may provide a thinner and lighter semiconductor package.

An interposer included in a semiconductor package according to an example embodiment may be between a lower semiconductor stack structure and an upper semiconductor stack structure and may include a capacitor therein. Accordingly, an electrical movement path between lower semiconductor chips included in the lower semiconductor stack structure and the capacitor and an electrical movement path between upper semiconductor chips included in the upper semiconductor stack structure and the capacitor may be shortened. Accordingly, noise in a high frequency band of the lower semiconductor chips and the upper semiconductor chips may be reduced or prevented from occurring.

In addition, because the interposer may include the capacitor inside the interposer substrate, the semiconductor package including the interposer may be thinner and lighter.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a lower semiconductor chip including a lower through-electrode;
    an interposer mounted on the lower semiconductor chip, the interposer including:
        an interposer substrate,
        a plurality of interposer through-electrodes penetrating through at least a portion of the interposer substrate in a vertical direction and electrically connected to the lower through-electrode, and
        at least one capacitor completely contained within an upper surface and a lower surface of the interposer substrate and electrically connected to at least one interposer through-electrode of the plurality of interposer through-electrodes; and
    an upper semiconductor chip mounted on the interposer and electrically connected to the plurality of interposer through-electrodes.

2. The semiconductor device as claimed in claim 1, wherein the at least one capacitor is at an outer side of the plurality of interposer through-electrodes.

3. The semiconductor device as claimed in claim 1, wherein the at least one capacitor includes:
    a first conductive plate extending in a horizontal direction; and
    a second conductive plate spaced apart from the first conductive plate in the vertical direction.

4. The semiconductor device as claimed in claim 3, wherein the interposer further includes a redistribution pattern in the interposer substrate, the redistribution pattern connecting the at least one capacitor to the at least one interposer through-electrode of the plurality of interposer through-electrodes.

5. The semiconductor device as claimed in claim 1, wherein the at least one capacitor is between two interposer through-electrodes of the plurality of interposer through-electrodes.

6. The semiconductor device as claimed in claim 1, wherein:
    the at least one capacitor includes plurality of capacitors in the interposer substrate, and
    the plurality of capacitors are connected in parallel.

7. A semiconductor device, comprising:
    a base semiconductor chip including a base through-electrode;
    a first lower semiconductor chip mounted on the base semiconductor chip, the first lower semiconductor chip having a horizontal length less than a horizontal length of the base semiconductor chip, including a first lower through-electrode, and being electrically connected to the base through-electrode;
    a second lower semiconductor chip mounted on the first lower semiconductor chip, the second lower semiconductor chip including a second lower through-electrode electrically connected to the first lower through-electrode;
    an interposer mounted on the second lower semiconductor chip, the interposer including:
        an interposer substrate,
        a plurality of interposer through-electrodes penetrating through at least a portion of the interposer substrate in a vertical direction and being electrically connected to the second lower through-electrode, and
        at least one capacitor in the interposer substrate and connected to at least one interposer through-electrode of the plurality of interposer through-electrodes;
    a first upper semiconductor chip mounted on the interposer and including a first upper through-electrode electrically connected to at least one interposer through-electrode of the plurality of interposer through-electrodes;
    a second upper semiconductor chip mounted on the first upper semiconductor chip; and
    a molding layer on the base semiconductor chip and surrounding the first lower semiconductor chip, the second lower semiconductor chip, the interposer, and the first upper semiconductor chip.

8. The semiconductor device as claimed in claim 7, wherein:
    a horizontal length of the interposer is greater than the horizontal length of the first lower semiconductor chip and is less than the horizontal length of the base semiconductor chip, and
    the interposer includes:
        a first region overlapping the first lower semiconductor chip and the second lower semiconductor chip in the vertical direction, and
        a second region protruding beyond a side surface of the first lower semiconductor chip and a side surface of the second lower semiconductor chip.

9. The semiconductor device as claimed in claim 8, wherein:
    the interposer includes a first wire bonding pad on the second region thereof,
    the base semiconductor chip includes a second wire bonding pad thereon, and the semiconductor device further includes a conductive wire connecting the first wire bonding pad to the second wire bonding pad.

10. The semiconductor device as claimed in claim 8, further comprising a third lower semiconductor chip outside the first lower semiconductor chip and the second lower semiconductor chip and between the second region of the interposer and the base semiconductor chip,
wherein the third lower semiconductor chip includes a third lower through-electrode electrically connecting the interposer to the base semiconductor chip.

11. The semiconductor device as claimed in claim 7, wherein:
the at least one capacitor includes:
a first conductive plate extending in a horizontal direction in the interposer substrate, and
a second conductive plate extending in the horizontal direction in the interposer substrate, the second conductive plate being spaced apart from the first conductive plate in the vertical direction, and
a material of the interposer substrate includes silicon.

12. The semiconductor device as claimed in claim 11, wherein:
the first conductive plate and the second conductive plate of the at least one capacitor are at an outer side of the plurality of interposer through-electrodes, and
the interposer further includes a redistribution pattern in the interposer substrate and electrically connecting the at least one capacitor to the at least one interposer through-electrode of the plurality of interposer through-electrodes.

13. The semiconductor device as claimed in claim 7, wherein the at least one capacitor is between two interposer through-electrodes of the plurality of interposer through-electrodes.

14. The semiconductor device as claimed in claim 7, wherein:
the at least one capacitor includes plurality of capacitors the interposer substrate, and
the plurality of capacitors are connected in parallel.

15. The semiconductor device as claimed in claim 7, wherein side surfaces of the first lower semiconductor chip, the second lower semiconductor chip, the interposer, the first upper semiconductor chip, and the second upper semiconductor chip are coplanar with each other.

16. The semiconductor device as claimed in claim 7, wherein the molding layer is coplanar with an upper surface of the second upper semiconductor chip.

17. A semiconductor package, comprising:
a package substrate;
a base semiconductor chip mounted on the package substrate and having a base through-electrode;
a lower semiconductor stack structure mounted on the base semiconductor chip, the lower semiconductor stack structure having a horizontal length less than a horizontal length of the base semiconductor chip and including a first lower semiconductor chip mounted on the base semiconductor chip and having a first lower through-electrode electrically connected to the base through-electrode, and a second lower semiconductor chip mounted on the first lower semiconductor chip and having a second lower through-electrode electrically connected to the first lower through-electrode;
an interposer mounted on the lower semiconductor stack structure, the interposer including:
an interposer substrate,
a plurality of interposer through-electrodes penetrating through at least a portion of the interposer substrate in a vertical direction and electrically connected to the second lower through-electrode,
a capacitor in the interposer substrate and electrically connected to the plurality of interposer through-electrodes, and
a redistribution pattern connecting the capacitor to at least one interposer through-electrode of the plurality of interposer through-electrodes;
an upper semiconductor stack structure mounted on the interposer and including a first upper semiconductor chip mounted on the interposer and electrically connected to the plurality of interposer through-electrodes; and a second upper semiconductor chip mounted on the first upper semiconductor chip; and
a molding layer on the base semiconductor chip and surrounding the lower semiconductor stack structure, the interposer, and the upper semiconductor stack structure.

18. The semiconductor package as claimed in claim 17, wherein:
a horizontal length of the interposer is greater than a horizontal length of each of the lower semiconductor stack structure and the upper semiconductor stack structure, and
the interposer includes:
a first region overlapping the first lower semiconductor chip and the second lower semiconductor chip in the vertical direction, and
a second region protruding beyond a side surface of the first lower semiconductor chip and a side surface of the second lower semiconductor chip.

19. The semiconductor package as claimed in claim 18, wherein:
the interposer includes a first wire bonding pad on the second region thereof,
the base semiconductor chip includes a second wire bonding pad thereon, and
the semiconductor package further includes a conductive wire connecting the first wire bonding pad to the second wire bonding pad.

20. The semiconductor package as claimed in claim 18, further comprising a third lower semiconductor chip outside the lower semiconductor stack structure and between the second region of the interposer and the base semiconductor chip,
wherein the third lower semiconductor chip includes a third lower through-electrode electrically connecting the interposer to the base semiconductor chip.

* * * * *